United States Patent
Yamashita et al.

(10) Patent No.: US 6,489,844 B2
(45) Date of Patent: Dec. 3, 2002

(54) FEED-FORWARD AMPLIFIER AND CONTROLLER OF THE SAME

(75) Inventors: Kazuo Yamashita, Mitaka (JP); Akira Ito, Mitaka (JP); Hironori Sakamoto, Mitaka (JP); Keijiro Ito, Mitaka (JP); Akira Yamada, Mitaka (JP); Norihisa Kawasumi, Mitaka (JP)

(73) Assignee: Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 09/735,759

(22) Filed: Dec. 13, 2000

(65) Prior Publication Data

US 2001/0015673 A1 Aug. 23, 2001

(30) Foreign Application Priority Data

Dec. 28, 1999 (JP) ............................. 11-374869

(51) Int. Cl.[7] ................................. H03F 3/66
(52) U.S. Cl. ........................... 330/52; 330/151
(58) Field of Search ................ 330/52, 149, 151

(56) References Cited

U.S. PATENT DOCUMENTS

| | | | | |
|---|---|---|---|---|
| 5,528,196 A | * | 6/1996 | Baskin et al. | 330/151 |
| 5,768,699 A | * | 6/1998 | Behan et al. | 330/151 |
| 5,926,067 A | * | 7/1999 | Myer et al. | 330/52 |
| 5,929,701 A | * | 7/1999 | Rice | 330/52 |
| 6,157,254 A | * | 12/2000 | Myer | 330/52 |
| 6,172,560 B1 | * | 1/2001 | Yamashita et al. | 330/52 |

FOREIGN PATENT DOCUMENTS

| | | |
|---|---|---|
| JP | 01198809 A | 10/1989 |
| JP | 04083406 A | 3/1992 |
| JP | 04083407 A | 3/1992 |
| JP | 04070203 A | 5/1992 |
| JP | 04233809 A | 8/1992 |
| JP | 04233811 A | 8/1992 |
| JP | 04286209 A | 12/1992 |
| JP | 05243880 A | 9/1993 |
| JP | 07022854 A | 1/1995 |
| JP | 07106861 A | 4/1995 |
| JP | 08056126 A | 2/1996 |
| JP | 11177351 A | 2/1999 |
| JP | 196366 A | 7/2000 |

* cited by examiner

*Primary Examiner*—Robert Pascal
*Assistant Examiner*—Khanh Van Nguyen
(74) *Attorney, Agent, or Firm*—Samuels, Gauthier & Stevens, LLP

(57) ABSTRACT

A feed-forward amplifier and a controller thereof. Two types of second pilot signals, sum frequency and difference frequency of a base pilot signal and a local oscillation signal, are generated by an injection-side mixer and injected into a distortion detection loop. Part of a signal appearing at an output terminal is branched, converted in frequency by a detection-side mixer using the local oscillation signal, filtered by a narrow-band filter, input to a synchronizing detector with the filtered output of the filter as error signals, and synchronizing detected with reference to the base pilot signal so as to generate control signals for a distortion rejection loop. The spectrums of the second pilot signals may be spread. A process to cancel the input signal component at the detection side may be performed. A simple circuit configuration enhances the distortion component rejection and suppression effect and shortens the time required until an optimum control state is established.

15 Claims, 23 Drawing Sheets

FEED-FORWARD AMPLIFIER AND CONTROLLER OF THE SAME

BACKGROUND OF THE INVENTION

1. Field of the Invention

The present invention relates to a feed-forward amplifier, which contributes to low-distortion amplification of electric signals, and a controller of the same.

The present invention is applicable to low-distortion amplification of multi-carrier signals or spread spectrum modulated signals. Expressed in more general terms, the present invention contributes to improvement in the quality of transmission signals in the fields of radio communications and cable communications. The feed-forward amplifier relating to the present invention is usable in base stations and repeaters for cellular telephones, broadcasting stations and relay stations for terrestrial wave digital television broadcasting systems, and various other systems requiring low-distortion amplification.

2. Description of the Related Art

Cellular telephone systems, in particular such systems using terrestrial waves, have a common configuration in which a large number of base stations are geographically dispersed from each other while users carry mobile stations. Furthermore, there are instances where a repeater is provided between the base station and the mobile station. Radio frequency amplifiers are provided at the base stations and at the repeaters to power-amplify the transmitting radio frequency signals to the mobile stations, to which strict low-distortion characteristics are required due to the reasons given in the following.

First, the input versus output characteristics of the amplifier inevitably exhibit some non-linearity of varying degrees. Distortion components generated by this non-linearity are of many types including harmonics, cross-modulation distortion, and intermodulation distortion. It is necessary to reject or suppress these distortion components that cause degradation of the signal quality. Some distortion components, such as harmonics, which often appear at frequencies considerably separated from the frequency band occupied by the input signal to the amplifier can be rejected by a filter provided at a stage subsequent to the amplifier. However, the remaining distortion components, such as cross-modulation distortion and intermodulation distortion having a frequency that is identical or extremely close to the frequency of the input signal to the amplifier are difficult or impossible to reject by such a filter. In particular, when the amplifier amplifies a plurality of carriers having frequencies extremely close to each other, neither the cross-modulation nor intermodulation distortion component can be rejected with a filter.

Cellular telephone systems are implemented according to mutually different standards in various countries in the world. Among these standards, the PDC (Personal Digital Cellular) standard cellular telephone system implemented in Japan, the GSM (Global System for Mobile communication) standard cellular telephone system implemented in many countries, such as in Europe, the IS-54/IS-136 standard cellular telephone system implemented in the US, and the EDGE (Enhanced Data-rates for GSM Evolution) standard cellular telephone system and the GPRS (General Packet Radio System) standard cellular telephone system, which are both called 2.5 generation cellular telephone systems, use many carriers having frequencies extremely close to each other. The CDMA (Code Division Multiple Access) standard cellular telephone system, which is currently being popularized or developed in various countries, transmits spread spectrum modulated signals. This type of system has been implemented in the U.S., Japan, and South Korea under the designation of cdmaOne or IS-95, and there are plans for its implementation under the designation of W-CDMA (Wideband CDMA), IMT-2000 (International Mobile Telecommunication-2000) or cdma2000.

As was clearly summarized in the above, a common characteristic of current and future cellular telephone systems is that the signals to be transmitted between a base station or repeater and a mobile station, or between a base station and a repeater include a plurality of components having frequencies extremely close to each other. More precisely, a signal including a plurality of frequency components having frequencies extremely close to each other is input to a radio frequency power amplifier (multi-carrier amplifier) in base stations or repeaters for the PDC, GSM, IS-54/IS-136, EDGE, and GPRS standards, or spread spectrum modulated signal is input to a radio frequency power amplifier in base stations or repeaters for the CDMA standard. Thus, the frequency components in the input signal are susceptible to cross-modulation or intermodulation. Furthermore, since the input signal includes many carriers or is spread spectrum modulated, distortion components are liable to appear due to the non-linearity of the amplifier. Namely, the radio frequency-power amplifier of base stations and repeaters for cellular telephone systems requires a scheme to suppress the generation of distortion components represented by the intermodulation distortion components, or an improvement to lower or eliminate distortion.

The radio frequency power amplifier of base stations and relay stations for terrestrial wave digital television broadcasting systems also requires a similar scheme. For example, since the terrestrial wave digital television broadcasting system planned for implementation in Japan transmits signals in which many carriers are multiplexed in accordance with the OFDM (Orthogonal Frequency Division Multiplex) standard, its amplifiers require an improvement to reduce or eliminate distortion.

However, it is impossible to realize an amplifier having ideal low-distortion characteristics, and it is often difficult to realize even an amplifier having near-ideal low-distortion characteristics due to constraints in terms of cost and circuit size. One approach for solving this problem is to add to the amplifier a circuit to reject or suppress the distortion components that are generated in the amplifier. This approach has been implemented heretofore in a form where a circuit is provided to detect the distortion components included in the output signal of the amplifier, and in accordance with the result thereof, to perform automatic control so as to minimize the distortion components included in the output signal of the amplifier. This type of amplifier having an additional circuit is called a distortion compensation amplifier.

One known type of distortion compensation amplification system of the prior art is the feed-forward system. Generally, the feed-forward system is adopted with an object to enable the maximum suppression or rejection, among the residual distortion components in the amplifier output, of the distortion components that are difficult to reject at a filter stage or the like, to enable the maintenance of desirable distortion component rejection and suppression performance even in the event of temperature variations or deterioration due to aging, and once this is achieved, to maintain and improve the quality of the transmission signals by obtaining a low-distortion amplified output. The distortion compensation amplifier adopting the feed-forward system is called a feed-forward amplifier.

The feed-forward amplifier comprises a main amplifier for amplifying signals, a distortion detection loop, which is a feed-forward loop for detecting the distortion components generated at the main amplifier, a distortion rejection loop, which is a feed-forward loop for rejecting or suppressing these distortion components from the output signal, and a controller for automatically controlling the operation of the distortion detection loop and the distortion rejection loop. Hitherto, various improvements and modifications have been proposed for the feed-forward amplifier. Relevant references include patents issued in Japan such as Japanese Patent Publication No. Hei 7-77330, Patent Nos. 2711413, 2711414, 2799911, 2804195, 2948279, 2945451, and 2945447, or corresponding laid-open publications including the original disclosure by one of the applications i.e. Japanese Patent Laid-Open Publication Nos. Hei 1-198809, 4-233811, 4-233809, 4-286209, 5-243880, 4-83406, 4-83407, and 4-70203.

FIG. 30 shows a typical configuration of the feed-forward amplifier in the prior art based on the disclosures in these patents and publications. The signal that is input by the feed-forward amplifier shown in FIG. 30 via an input terminal 1 from a circuit (not shown) of a previous stage, such as a modulator, is amplified by a main amplifier 5 and supplied from an output terminal 2 to a subsequent circuit such as an antenna or a filter previous to the antenna. Of the two types of feed-forward loops associated with this signal path, the distortion detection loop comprises a distributor 3, a vector adjustment circuit 4, the main amplifier 5, a delay circuit 6, and a directional coupler 7, and the distortion rejection loop comprises a gain adjustment circuit 8, a phase adjustment circuit 9, a sub-amplifier 10, a directional coupler 11, and a delay circuit 12. A controller 17 is a circuit for controlling the adjustment operations (to be explained hereinafter) in the distortion detection loop and the distortion rejection loop. A distributor 13, an oscillator 14, a narrow-band filter 15, and a receiver 16 form a circuit to achieve control by the controller 17 or form part of the controller 17.

The distributor 3 distributes an input signal from the input terminal 1 to the main amplifier 5 and the delay circuit 6. The main amplifier 5 amplifies the input signal that was distributed from the distributor 3 and supplies a resulting output signal A to the directional coupler 7. On the other side, the delay circuit 6 delays the signal that was distributed from the distributor 3 and supplies it to the directional coupler 7. The directional coupler 7 supplies on the one hand the output signal A from the main amplifier 5 to the directional coupler 11 via the delay circuit 12, and branches on the other hand part of the output signal A and couples it with a signal from the delay circuit 6. The directional coupler 7 supplies to the sub-amplifier 10 the signal obtained from coupling the part of the output signal A with the signal from the delay circuit 6. The sub-amplifier 10 amplifies the signal from the directional coupler 7 and supplies it to the directional coupler 11. The directional coupler 11 couples the signal delayed by the delay circuit 12 with the signal amplified by the sub-amplifier 10, and outputs a resulting signal B via the output terminal 2 to a circuit of a subsequent stage.

The two signals distributed by the distributor 3 do not include distortion components generated in the main amplifier 5, whereas the output signal A from the main amplifier 5 includes distortion components generated in the main amplifier 5. Therefore, among the two signals to be coupled at the directional coupler 7, one includes distortion components whereas the other does not. Furthermore, each of these two signals includes the main signal component, namely, the component corresponding to the signal that is input to the main amplifier 5 via the input terminal 1. Therefore, if the main signal components, which are the common components in these two signals, have the same amplitude and opposite phase at the signal coupling point within the directional coupler 7, the signal that is supplied to the sub-amplifier 10 from the directional coupler 7 becomes a signal including predominantly distortion components.

Furthermore, the signal supplied to the directional coupler 11 via the delay circuit 12 includes the distortion components generated by the main amplifier 5, and the signal amplified by the sub-amplifier 10, in general terms, includes only the distortion components generated at the main amplifier 5. Therefore, the two signals to be coupled at the directional coupler 11 each include the distortion components generated at the main amplifier 5. If these distortion components have the same amplitude and opposite phase at the signal coupling point within the directional coupler 11, the distortion components do not appear in the signal that is output via the output terminal 2 from the directional coupler 11.

To realize the amplitude and phase relationship between two signals at the signal coupling points within the directional couplers 7 and 11, the vector adjustment circuit 4 has been provided in the distortion detection loop, and the gain adjustment circuit 8 and the phase adjustment circuit 9 have been provided in the distortion rejection loop. The vector adjustment circuit 4 adjusts the component values for amplitude and phase in at least one of the distributed outputs from the distributor 3, which in effect adjusts the amplitude and phase relationship. The gain adjustment circuit 8 and the phase adjustment circuit 9 respectively adjust the amplitude and phase of at least one of the two signals that are output from the directional coupler 7. In FIG. 30, the distributed output to the main amplifier 5 and to the sub-amplifier 10 undergo adjustment whereas the signals via the delay circuits 6 and 12 may also undergo adjustment. This point is similar also in an embodiment of the present invention to be described hereinafter.

The vector adjustment circuit 4, the gain adjustment circuit 8, and the phase adjustment circuit 9 may be realized by a quadrature modulator, by a variable gain amplifier or a variable attenuator, and by a variable phase shifter, respectively. The vector adjustment circuit 4 may be realized in a combination of circuits similar to the combination of the gain adjustment circuit 8 and the phase adjustment circuit 9, the gain adjustment circuit 8 and the phase adjustment circuit 9 may be replaced by a circuit similar to the vector adjustment circuit 4, and the order of the gain adjustment circuit 8 and the phase adjustment circuit 9 can be transposed. Similar modification is also applicable to an embodiment of the present invention to be described hereinafter. The delay circuits 6 and 12 are means for compensating for the signal delays generated in the signal paths through the main amplifier 5 and through the sub-amplifier 10, which are provided in parallel to the delay circuits 6 and 12 respectively, and can be realized with various delay lines or members having equivalent functions. This possible modification or design is applicable also in an embodiment of the present invention to be described hereinafter.

In the heretofore known feed-forward amplifier, the adjustments in the vector adjustment circuit 4, as well as the gain adjustment circuit 8 and the phase adjustment circuit 9, are respectively set and controlled to optimum values so that the signal that is supplied to the sub-amplifier 10 includes predominantly distortion components and so that the signal appearing at the output terminal 2 does not include distortion components. So that an optimum control state is always obtained to cope with variations in ambient temperature and aging performance of component parts, control is performed heretofore using a pilot signal. In the publications and patents given earlier, at least two types of pilot signals are used. Namely, a first pilot signal for optimizing the distortion detection loop and a second pilot signal for optimizing the distortion rejection loop.

The first pilot signal is injected into the main signal in a stage prior to the distributor 3 so as to appear in both signals to be coupled at the directional coupler 7. If the state of the distortion detection loop has been optimized, the first pilot signal is canceled in the same manner as the main signal component by the signal coupling operation in the directional coupler 7, and the signal that is supplied to the sub-amplifier 10 should be a signal of only distortion components.

By testing whether or not the first pilot signal remains in the signal that is supplied to the sub-amplifier 10, and appropriately setting and updating the adjustment at the vector adjustment circuit 4 so as to minimize the residual pilot signal, it is possible to place the control state of the distortion detection loop in an optimum state and to have the signal that is supplied to the sub-amplifier 10 include only distortion components. It should be noted that the circuit for generating, injecting, and detecting the first pilot signal, and supplying control signals to the vector adjustment circuit 4 has been omitted from FIG. 30. This circuit is realized by a circuit configuration similar to a circuit (to be described hereinafter) relating to injection and detection of the second pilot signal as well as the optimized control of the distortion rejection loop.

On the other hand, the second pilot signal is injected into the signal at an arbitrary point on the signal path from the signal branch point within the distributor 3 to the signal branch point within the directional coupler 7 via the main amplifier 5 so as to appear in both of the two types of signals to be coupled at the directional coupler 11. In the example shown in FIG. 30, the second pilot signal of frequency f generated at the oscillator 14 is injected into the signal at the main amplifier 5. For example, the injection point is between stages of a plurality of amplifiers cascaded to form the main amplifier 5. If the control state of the distortion rejection loop is optimum, the second pilot signal is canceled in the same manner as the distortion components by the signal coupling operation in the directional coupler 11, and the signal appearing at the output terminal 2 should not include the distortion components.

To optimize the distortion rejection loop, the circuit shown in FIG. 30 executes the following operation. First, the distributor 13 that is provided between the directional coupler 11 and the output terminal 2 branches part of the output signal. Furthermore, the narrow-band filter 15 extracts from the branched signal the component of a sufficiently narrow band to which the frequency of the second pilot signal belongs. The extracted component is considered to be the second pilot signal that remained in the output signal from the output terminal 2. The receiver 16 detects its level. The controller 17 considers the detected level, namely, the amount remaining of the second pilot signal, to be an index indicating the amount remaining of the distortion component, on the basis of which the control signals are generated. By applying the generated control signals to the gain adjustment circuit 8 and the phase adjustment circuit 9, the controller 17 appropriately sets and updates the adjustments for amplitude and phase.

As described in the publications and patents given earlier, the controller 17 generally has the configuration shown in FIG. 31. In the circuit shown in FIG. 31, the level of received voltage detected by the receiver 16 is converted to digital data by an A/D converter 171 and input to a CPU 172. The digital data items obtained as a result of a process in the CPU 172 to determine the control signal values are converted to analog control signals (control voltages) by a D/A converter 174 and supplied to the gain adjustment circuit 8 and the phase adjustment circuit 9.

As described in the publications and patents given earlier, the process in the CPU 172 to determine the control signal values is normally realized as a step-by-step search process by alternately varying the amplitude adjustment and phase adjustment in steps. In this process, the CPU 172 alternately executes a gain varying operation and a phase varying operation. The gain varying operation is an operation to investigate the direction of gain change for a lower level detection value in the receiver 16 by varying the amplitude (gain) adjustment in the gain adjustment circuit 8 in steps of a predetermined amount, and vary the gain in that direction, and the phase varying operation is an operation to investigate the direction of phase change for a lower level detection value in the receiver 16 by varying the phase adjustment (phase shift) in the phase adjustment circuit 9 in steps of a predetermined amount, and vary the phase in that direction. The alternate execution of operations is performed because by simultaneously varying the gain and phase shift, it cannot be determined whether the change in the level detection value is due to the change in gain or the change in phase shift. After finding a combination of gain and phase shift where the level detection value is the lowest by repeating this sort of process, this is held as long as a significant change in the level detection value does not appear. When a significant change appears in the level detection value, the same search process is again executed. As a result, the CPU 172 prevents the distortion rejection loop from deviating from an optimum state due to variations in ambient temperature, aging performance of the component parts, or the like. In the figure, a memory 173 is used by the CPU 172.

However, the prior art described above has the following problems.

First, the optimum control state of the distortion rejection loop was established and maintained heretofore by executing the step-by-step search process with the CPU 172 shown in FIG. 31 or a circuit employing a similar signal processor, in the prior art. For this reason, after control is initiated or once the operating conditions change, a few seconds to approximately 10 seconds were required to optimize the control state of the distortion rejection loop. During this period, since the distortion rejection loop is not in an optimum control state, the distortion components and second pilot signal remain in the output signal, and various difficulties are created including the generation of unnecessary radiation from an antenna of a subsequent stage.

Next, in the prior art, since the optimization control of the adjustment in the distortion rejection loop was executed in accordance with the amount (the detected level) of residual second pilot signal, the maximum effect of rejecting and suppressing the distortion components was obtained at the frequency of the second pilot signal (refer to FIG. 33). The reason the optimum control state can only be realized at one point is mainly due to the fact that the component parts forming the feed-forward amplifier do not have perfectly flat frequency characteristics. Furthermore, the reason the point at which the optimum control state is realized is at the frequency of the second pilot signal is due to the fact that automatic control is performed so that the amount of residual second pilot signal reaches a minimum. Thus, on one hand, it can be said that it is desirable to set the frequency of the second pilot signal to a frequency sufficiently close to the operating band (spectrum distributed band in the CDMA standard) of the feed-forward amplifier. On the other hand, in order to preferably detect the amount of residual second pilot signal at the receiver 16, it is necessary to set the frequency of the second pilot signal so that the residual second pilot signal can be preferably separated and extracted at the narrow-band filter 15. Namely, it is desirable to set the frequency of the second pilot signal to a frequency that is sufficiently separated from the operating band of the feed-forward amplifier.

To reach a compromise between these conflicting conditions, heretofore, the frequency f (refer to FIGS. 32 and 33) of the second pilot signal was set outside the operating band of the feed-forward amplifier, and the difference $\Delta f$ with the operating band of the feed-forward amplifier was set to maximize the effect of rejecting and suppressing the distortion components in the operating band of the feed-forward amplifier, yet to allow the residual second pilot signal to be extracted at the narrow-band filter 15. Apparently, the necessity of such delicate settings to obtain a balance between conflicting requests becomes a difficulty when designing and using the feed-forward amplifier. Furthermore, since sufficient narrowing of difference $\Delta f$ is not allowed once the residual pilot signal can be preferably extracted, the effect of rejecting and suppressing the distortion components in the operating band of the feed-forward amplifier cannot be increased sufficiently to an extent close to the theoretical maximum limit.

SUMMARY OF THE INVENTION

The present invention is intended to solve the aforementioned problems by obviating the need to perform step-by-step adjustment control processing using a processing member represented by a CPU, by establishing an optimum control state in the distortion rejection loop in a time shorter than in the prior art, by realizing a more stable control of the distortion rejection loop, and by improving the distortion component rejection and suppression effect in the operating band of the feed-forward amplifier without delicate settings of the pilot signal frequency and with a simple circuit.

One aspect of the present invention is a controller used in the feed-forward amplifier comprising the main amplifier, the distortion detection loop for coupling part of the input signal to the main amplifier and part of the output signal from the main amplifier by adjusting a mutual relationship of amplitude and phase thereof so as to generate a distortion signal, and the distortion rejection loop for coupling the distortion signal and the output signal from the main amplifier by adjusting a mutual relationship of amplitude and phase thereof so as to generate a low-distortion output signal. The controller according to the present invention controls the above-mentioned adjustment operation by supplying control signals to the distortion detection loop and the distortion rejection loop so as to suppress distortion components generated by the main amplifier and remaining in the low-distortion output signal. Furthermore, another aspect of the present invention is the feed-forward amplifier that comprises the main amplifier, the distortion detection loop, the distortion rejection loop, and a controller according to the present invention.

The controller according to the present invention comprises an injection-side mixer, a detection-side mixer, and a synchronizing detector.

The injection-side mixer up-converts the base pilot signal using the local oscillation signal, to generate an upper-side pilot signal having a frequency equal to the sum of the frequency of the base pilot signal and the frequency of the local oscillation signal, and a lower-side pilot signal having a frequency equal to the difference of the frequency of the base pilot signal and the frequency of the local oscillation signal. The injection-side mixer injects the generated upper-side and lower-side pilot signals into the distortion detection loop so as to appear as respective signals to be coupled at the distortion rejection loop.

The state of the distortion rejection loop is considered to be in a non-optimum state when the upper-side and lower-side pilot signals remain in the low-distortion output signal. The detection-side mixer inputs part of the low-distortion output signal, and down-converts this low-distortion output signal to generate error signals of gain and phase which are in phase and at quadrature phase ($\pi/2$ [rad]) respectively, by using the same local oscillation signal that the injection-side mixer used during up-conversion and by using quadrature coupling.

The synchronizing detector performs synchronizing detection on the gain error signal and the phase error signal obtained in this manner with the base pilot signal as a reference signal. As a result, since the signals representing the error of the current control state with respect to the optimum control state are obtained as detected outputs of the synchronizing detector, the synchronizing detector supplies them as control signals to the distortion rejection loop (such as the gain and phase adjustment circuits or vector adjustment circuit). As a result, the state of the distortion rejection loop approaches an optimum state, and the distortion components remaining in the low-distortion output signal are rejected or suppressed.

The first point to be noted regarding the present invention is that the control signals are generated by performing synchronizing detection on the (second) pilot signal remaining in the low-distortion output signal with the base pilot signal as a reference signal. Thus, it becomes unnecessary to execute the step-by-step search process that was used in the prior art, and for this reason a CPU or processor becomes unnecessary. Furthermore, it is possible to simultaneously and automatically adjust both the gain and phase. Namely, according to the present invention, the time from the initiation of control until the establishment of the optimum control state or the time from a change in operating condition, such as temperature, until the re-establishment of the optimum control state can be shortened compared to the prior art in which the step-by-step search process is executed, thereby solving the problem of unnecessary radiation of the pilot signal and distortion components. Regarding this point, the present invention should be regarded as an application, modification, or improvement of the inventions already filed in Japan (Japanese Patent Application No. Hei 10-300667 and Japanese Patent Application No. Hei 11-191901) by the assignee of the present application.

Furthermore, in the prior art using only one type of pilot signal for distortion rejection loop optimization, the distortion component rejection and suppression effect reaches a maximum at the frequency of the pilot signal, thereby resulting in a problem where the maximum distortion component rejection and suppression effect cannot be obtained within the operating band of the main amplifier. The second point to be noted regarding the present invention is that two types of pilot signals (upper-side and lower-side pilot signals) are injected for distortion rejection loop optimization. The S distortion component rejection and suppression effect in the present invention reaches a maximum at a frequency lower than the frequency of the upper-side pilot signal and higher than the frequency of the lower-side pilot signal, such as in the vicinity of the frequency of the local oscillation signal.

The third point to be noted regarding the present invention is that the dominant frequencies of the local oscillation signal and the base pilot signal are set so that at least part of the frequency band that is used by the feed-forward amplifier is included between the frequency of the upper-side pilot signal and the frequency of the lower-side pilot signal. According to the present invention, within the frequency band that is used by the feed-forward amplifier, the obtained distortion component rejection and suppression effect is higher at least in the part existing between the frequency of the upper-side pilot signal and the frequency of the lower-side pilot signal than at the frequencies of the upper-side and lower-side pilot signals.

In a preferred embodiment of the present invention, furthermore, the point where the distortion component rejection and suppression effect reaches a maximum is placed within the frequency band that is used by the feed-forward amplifier by setting the dominant frequencies of the local oscillation signal and the base pilot signal.

In a certain embodiment, the dominant frequency $f_L$ of the local oscillation signal is placed within the frequency band that is used by the feed-forward amplifier, and the dominant frequency $f_P$ of the base pilot signal has a frequency lower than the dominant frequency $f_L$ of the local oscillation signal. Thus, the dominant frequency of the upper-side pilot signal becomes $f_L+f_P$, and the dominant frequency of the lower-side pilot signal becomes $f_L-f_P$. As a result, the distortion component rejection and suppression effect reaches a maximum near frequency $f_L$, which is within the frequency band that is used by the feed-forward amplifier. In particular, the dominant frequency $f_L$ of the local oscillation signal is preferably set to the center of the frequency band of the input signal to the main amplifier, and the dominant frequency $f_P$ of the base pilot signal is preferably set at a frequency equal to ½ or more of the frequency bandwidth that is used by the feed-forward amplifier so that a maximum or nearly maximum distortion component rejection and suppression effect can be obtained over the entire frequency band that the input signal to the main amplifier occupies.

In another embodiment, it is assumed the frequency band that is used by the feed-forward amplifier is divided into a plurality of channels, each having a predetermined channel width. In this embodiment, the dominant frequency $f_L$ of the local oscillation signal is placed within the guard band that has been provided between channels for channel separation, and the dominant frequency $f_P$ of the base pilot signal is a frequency that is a natural multiple of the channel width. As a result, the distortion component rejection and suppression effect reaches a maximum within a plurality of channels sandwiched by frequency $f_L+f_P$ and frequency $f_L-f_P$, particularly in the channels in the vicinity of frequency $f_L$.

The terminology "dominant frequency" is used in the description above because an embodiment may spread the spectrums of the upper-side and lower-side pilot signals. Furthermore, although one preferred embodiment of the present invention has a first oscillator for generating the local oscillation signal and a second oscillator for generating the base pilot signal, they are not essential in embodying the present invention. For example, if oscillators oscillating at the same frequencies are provided in the circuit of an earlier stage such as a modulator, the required signals may then be as input from the oscillators.

The fourth point to be noted regarding the present invention is that the pilot signal for use in the optimized control of the distortion rejection loop, namely, the signal corresponding to the second pilot signal in the prior art, is generated from the up-conversion of the base pilot signal by mixing with the local oscillation signal. Therefore, by down-converting part of the low-distortion output signal into two signals, that are in phase and at quadrature phase, by the detection-side mixer using the same local oscillation signal, the upper-side and lower-side pilot signals remaining in the low-distortion output signal can be extracted and down-converted to the frequency of the base pilot signal, enabling the detection of control errors of gain and phase in the frequency band of the base pilot signal. The control signals are generated on the basis of detected control errors through the synchronizing detection of the down-converted signals. Since the same local oscillation signal can be used for both up-conversion and down-conversion and the base pilot signal can be used as a reference signal during synchronizing detection, and thus the fluctuation in upper- and lower-side pilot signal frequencies due to the fluctuation in the frequency of the base pilot signal or the local oscillation signal is cancelled by the down-conversion, the control signals can be generated without causing errors in control signals due to the frequency fluctuations in the frequency of the local oscillation signal or the base pilot signal. In other words, a low-cost design is possible with the use of oscillators that are not particularly stable.

Furthermore, members necessary for the injection of pilot signals and the detection of the remaining amount, and for the generation of control signals, are the injection-side mixer, the detection-side mixer, and the synchronizing detector. Thus, the circuitry relating to the present invention has a simple configuration compared to the circuitry of the prior art. According to the present invention, simplification of the circuit configuration is achieved, including a reduction in the number of mixers and detectors, and the circuit configuration of the controller relating to the present invention is simple when compared to the art according Japanese Patent Laid-Open Publication Nos. Hei 7-106861 and 8-56126, even when taking into consideration the filter, distributor, and directional coupler to be described hereinafter.

Japanese Patent Laid-Open Publication Nos. Hei 7-106861 and 8-56126 show the use of two types of second pilot signals having different frequencies from each other. However, since the two types of second pilot signals were generated respectively by separate oscillators, the number of oscillators, mixers, and detectors in the circuitry described in these publications is inevitably greater than the number in the present invention. Furthermore, the operation of injecting both the sum and difference frequency components appearing in the mixer output as pilot signals is not disclosed or suggested in these publications.

Furthermore, the levels of the upper-side and lower-side pilot signals to be injected can be set arbitrarily. In a preferred embodiment of the present invention, the levels are kept as low as possible in order to minimize circuit configuration, lower costs, and reduce power consumption. If the upper-side and lower-side pilot signals are at low levels, their residual levels in the low-distortion output signal are also low. Furthermore, since the control of the distortion rejection loop is performed with the aim of minimizing the remaining amount of the pilot signals as much as possible, their remaining amount (level) in the low-distortion output signal becomes lower as the optimum control state is approached. On the other hand, the main signal component is also included in the low-distortion output signal. The main signal component acts as a noise component or unnecessary component during detection of the residual pilot signals.

In a preferred embodiment of the present invention, the following process reduces the main signal component acting as the noise component or unnecessary component. Namely, a signal including the component corresponding to and having an opposite phase to the signal to be amplified by the main amplifier (but not including the upper-side and lower-side pilot signals) is added to the branched low-distortion output signal to be input to the detection-side mixer so as to cancel the main signal component from among the components included in the low-distortion output signal to be input to the detection-side mixer. Thus, the main signal component included in the input to the detection-side mixer, namely, the noise component or unnecessary component, is rejected or suppressed. As a result, the component corresponding to the main signal component, which acts as the noise or unnecessary component, is rejected or suppressed from the output after down conversion. Namely, according to a preferred embodiment of the present invention, the residual pilot signals can be detected in a stable manner in the form of error signals regardless of the fact that the residual pilot signals may be at extremely low levels. Furthermore, since the dynamic range of the detection-side mixer may be narrow, this also enhances the effects of minimizing circuit configuration, lowering costs, and reducing power consumption.

Furthermore, the upper-side and lower-side pilot signals in the present invention may be placed within or outside the frequency band that is used by the feed-forward amplifier. Although a single frequency signal may be respectively used for the upper-side and lower-side pilot signals, spread spectrum modulated signals may also be used. To prevent the upper-side and lower-side pilot signals from affecting the signal to be amplified and output, it is desirable to have the frequencies or spread spectrum bands of the upper-side and lower-side pilot signals outside the frequency band that is used by the feed-forward amplifier, or to use the spread spectrum modulated signals as the upper-side and lower-side pilot signals so that the pilot signals act as noise with respect to the component corresponding to the signal to be amplified at the feed-forward amplifier. To spread the spectrums of the upper-side and lower-side pilot signals to frequency bands having significant widths, a modulator may be provided to spread the spectrum of at least either the local oscillation signal or the base pilot signal.

Furthermore, a frequency where the distortion rejection and suppression effect reaches a maximum is definitely placed within the frequency band that is used by the feed-forward amplifier, by providing a modulator for spread spectrum modulation, or by setting the dominant frequencies of the local oscillation signal and the base pilot signal so that the frequencies of part or all of the spectrum distribution of the upper-side and lower-side pilot signal enter the frequency band of the signal to be amplified at the feed-forward amplifier. Thus, the distortion component rejection and suppression effect increases in the frequency band of the signal to be amplified at the feed-forward amplifier. In the embodiment employing this sort of frequency allocation, it is desirable to provide a circuit (already described) for performing anti-phase addition of part of the signal to be amplified at the feed-forward amplifier to the low-distortion output signal that is input by the detection-side mixer so as to stabilize the detection of the remaining amount of pilot signals.

It is desirable to provide a filter on the path supplying the error signals from the detection-side mixer to the synchronizing detector. This filter separates the frequency component at or including the base pilot-signal from the error signals obtained at the detection-side mixer, and supplies them to the synchronizing detector as error signals. Since the pilot signal in this embodiment is separated by the filter after down-conversion at the detection-side mixer, the selectivity of the filter for separating and extracting the residual pilot signal can be easily improved compared to the prior art in which the amount of the second pilot signal having a frequency adjacent to the operating band is directly detected. Thus, since the remaining amount of the pilot signal can be detected with more precision in the form of error signals, the precision of distortion compensation also improves.

Furthermore, when embodying the present invention using the upper-side and lower-side pilot signals that are spread in spectrum, in one embodiment, the reference signal that is input by the synchronizing detector becomes the signal that is spread in spectrum. When a filter for residual pilot signal separation and extraction is provided in this type of embodiment, the pass bandwidth of the filter is set wide according to the width of the spread spectrum band. In contrast, in an embodiment in which a modulator is arranged so as not to spread the spectrum of the reference signal and a circuit that performs despread spectrum modulation of the error signal is provided so that the synchronizing detector inputs an unmodulated signal, namely, a signal that is not spread spectrum modulated, the pass bandwidth of the filter for residual pilot signal separation and extraction can be set narrow to improve the selectivity.

Furthermore, the present invention can be understood to be an invention performing optimized control of the distortion rejection loop on the basis of a signal that has been rejected of the component corresponding to the signal to be amplified at the feed-forward amplifier among the components included in the low-distortion output signal. Namely, a second aspect of the present invention is a controller used in a feed-forward amplifier comprising a main amplifier, a distortion detection loop for coupling part of the input signal to the main amplifier and part of the output signal from the main amplifier by adjusting a mutual relationship of amplitude and phase thereof so as to generate a distortion signal, and a distortion rejection loop for coupling the distortion signal and the output signal of the main amplifier by adjusting a mutual relationship of amplitude and phase thereof so as to generate a low-distortion output signal, and controls the above-mentioned adjustment operation by supplying control signals to the distortion detection loop and the distortion rejection loop so as to suppress the distortion component generated at the main amplifier and remaining in the low-distortion output signal, and comprises means for branching part of the low-distortion output signal, means for performing anti-phase addition of part of the input signal to the main amplifier to part of the low-distortion output signal during or after branching, and means for generating the above-mentioned control signal for the distortion rejection loop on the basis of the signal from which has been rejected the component corresponding to the signal to be amplified at the feed-forward amplifier.

DETAILED DESCRIPTION OF THE PREFERRED EMBODIMENTS

Figure 1:
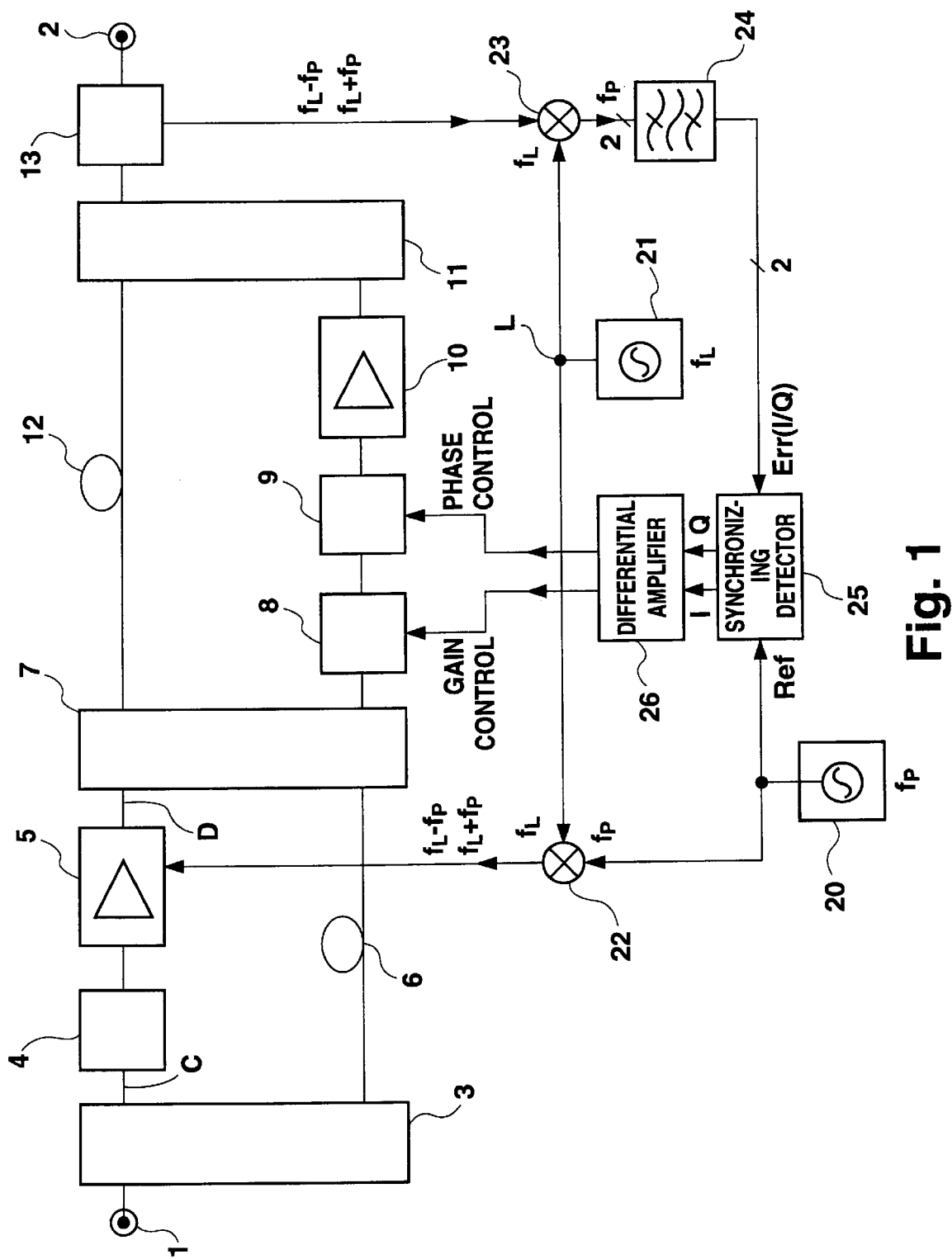
FIG. 1 is a block diagram showing a configuration of the feed-forward amplifier according to a first embodiment of the present invention.

Hereinafter, the preferred embodiments of the present invention will be described with reference to the accompanying drawings. Component parts corresponding or identical to those in the prior art shown in FIGS. 30 to 33 are given identical reference numerals and their descriptions will not be duplicated. Furthermore, corresponding or common component parts between embodiments are given identical reference numerals and their drawings and descriptions will not be duplicated.

(1) First Embodiment

FIG. 1 shows the configuration of the feed-forward amplifier according to the first embodiment of the present invention. In this figure, the circuitry concerning optimization control of the distortion detection loop is not shown so as to simplify the drawing. The configuration of the circuitry concerning optimization control of the distortion detection loop may, for example, use the first pilot signal as in the prior art. Alternatively, the circuit configuration with a synchronizing detector and an ALC circuit may be used, as the assignee of the present application has proposed in Japanese Patent Application Nos. Hei 10-300667 and 11-191901, to eliminate the first pilot signal. Furthermore, as the assignee of the application concerned has proposed in Japanese Patent Application No. Hei 11-119372, a scheme to improve the power efficiency may be adopted in which the control state of the distortion detection loop is shifted slightly from the optimum state or part of the signal prior to amplification is feed forwarded to the sub-amplifier 10.

One characteristic of the present embodiment is that an injection-side mixer 22 up-converts the base pilot signal having frequency $f_P$ generated at an oscillator 20 using the local oscillation signal having frequency $f_L$ generated at an oscillator 21, and the resulting generated upper-side pilot signal of frequency $f_L+f_P$ and lower-side pilot signal of frequency $f_L-f_P$ are injected in the distortion detection loop as second pilot signals. In FIG. 1, these upper- and lower-side pilot signals are injected at a point between cascaded stages in the main amplifier 5. However, they may be injected into another point, such as point C or point D, on a path from the signal branch point within the distributor 3 to the signal branch point within the directional coupler 7 via the main amplifier 5. Furthermore, the injection-side mixer 22 can be configured, for example, as a double balanced mixer.

In the present embodiment, furthermore, the distributor 13 branches part of the low-distortion output signal, which is a signal that is output to a subsequent stage via the output terminal 2 from the directional coupler 11, and a detection-side mixer 23 down converts the signal branched by the distributor 13 using a local oscillation signal (Lo in FIG. 2) in phase and at quadrature phase, which was generated at the oscillator 21 and also used in up-conversion. As a result of this down-conversion, signals of frequency $f_P$ are demodulated from the upper-side pilot signal of frequency $f_L+f_P$ remaining in the low-distortion output signal and the similarly remaining lower-side pilot signal of frequency $f_L-f_P$. A pair of signals ErrI and ErrQ having a difference in phase of $\pi/2$ [rad] from each other and indicating the residual parts of the pilot signals are obtained from the demodulation, and each has frequency $f_P$. When the control states of the distortion detection loop and the distortion rejection loop are not optimum, the pilot signals that were converted to frequency $f_P$ remain in signals ErrI and ErrQ. A narrow-band filter 24 filters the output signals from the detection-side mixer 23 to extract the residual pilot signals and so on and supplies them as gain and phase error signals ErrI and ErrQ to a synchronizing detector 25. The synchronizing detector 25 uses the base pilot signal supplied from the oscillator 20 as a reference signal Ref to perform synchronizing detection on the error signals ErrI and ErrQ. An I component output and a Q component output that are obtained as a result are supplied via a differential amplifier 26 to the gain adjustment circuit 8 and the phase adjustment circuit 9 as control signals.

Figure 2:
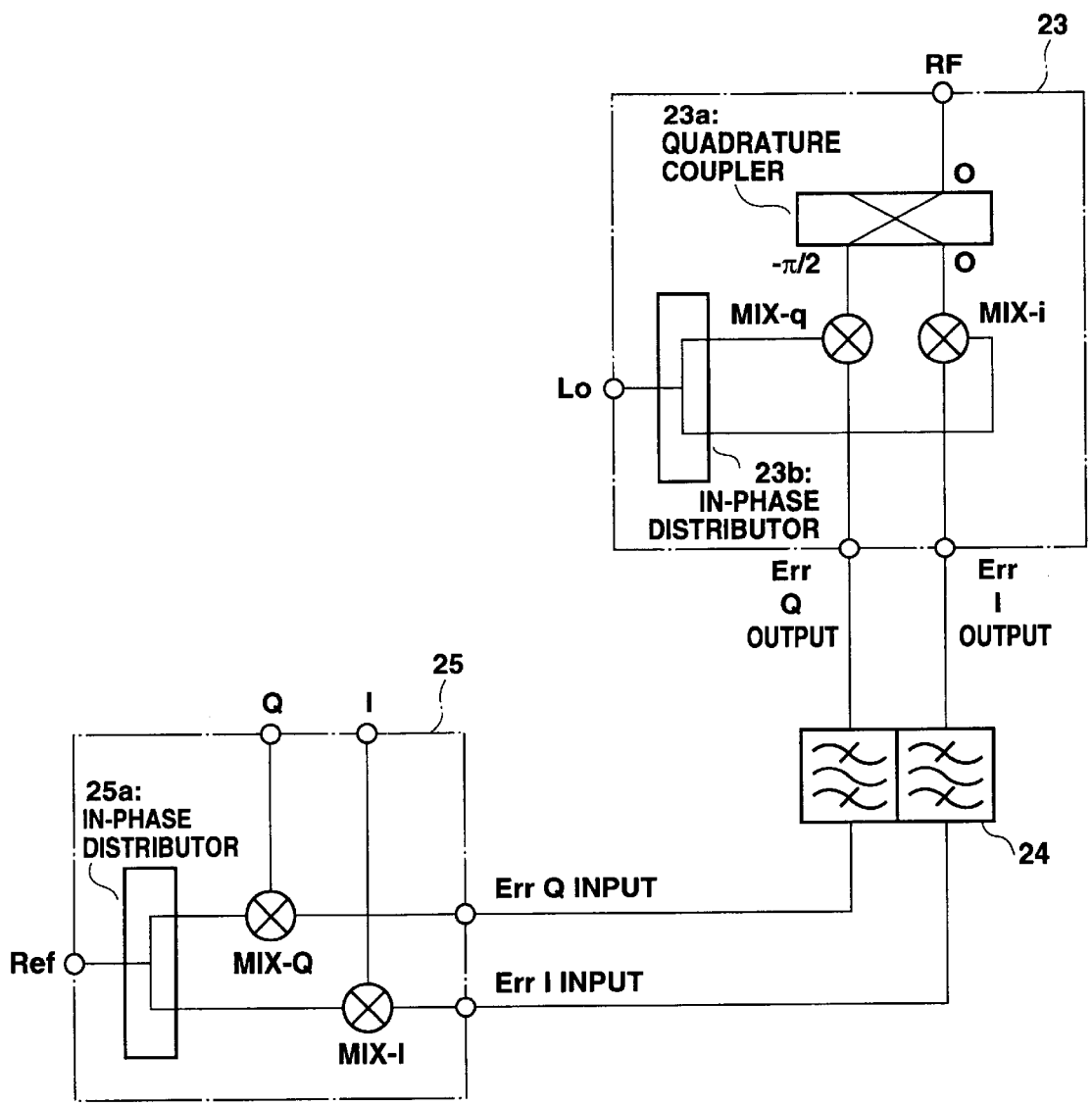
FIG. 2 is a block diagram showing an example configuration of a synchronizing detector and a detection-side mixer.
Figure 3:
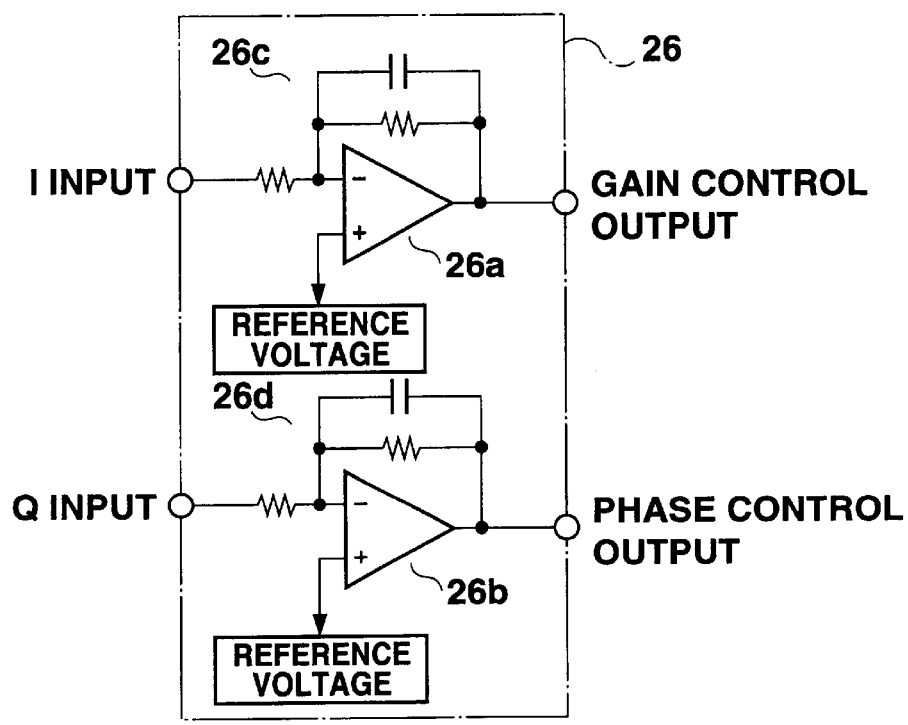
FIG. 3 is a block diagram showing an example configuration of an error amplifier.

The synchronizing detector 25 and the differential amplifier 26 have the configurations shown in FIGS. 2 and 3, respectively. In the detection-side mixer 23, a quadrature coupler 23a shifts the phase of the input signal from the distributor 13 to provide two outputs having the phase difference of 90° to two double balanced mixers MIX-i and MIX-q respectively. Furthermore, the local oscillation signal is distributed in phase by the in-phase distributor 23b to the two double balanced mixers MIX-i and MIX-q. The output ErrI of the double balanced mixer MIX-i, which is a product of the mutually in-phase components, is input to a double balanced mixer MIX-I in the synchronizing detector 25 via the narrow-band filter 24. Similarly, the output ErrQ of the double balanced mixer MIX-q, which is the product of in-quadrature components, is input to a double balanced mixer MIX-Q in the synchronizing detector 25 via the narrow-band filter 24.

In the synchronizing detector 25, the reference signal Ref is distributed in phase into two by an in-phase distributor 25a and input to double balanced mixers MIX-I and MIX-Q. Accordingly, the output of the double balanced mixer MIX-I, being a DC voltage indicative of the gain control error, is compared with a predetermined reference voltage, such as 0 V, by an operational amplifier 26a in the differential amplifier 26, and the voltage obtained as a result of the comparison is supplied as a control signal (control voltage) for gain control to the gain adjustment circuit 8. Similarly, the output of the double balanced mixer MIX-Q, being a DC voltage indicative of the phase control error, is compared with a predetermined reference voltage, such as 0 V, by an operational amplifier 26b in the differential amplifier 26, and the voltage obtained as a result of the comparison is supplied as a control signal (control voltage) for phase shift control to the phase adjustment circuit 9.

Accordingly, the phase shift that is generated in the path from point L in FIG. 1 through the injection-side mixer 22, the distortion rejection loop of the feed-forward amplifier, and distributor 13, to the RF input of the detection-side mixer 23 is denoted as $\beta$, and the phase shift of the direct path from point L to the Lo input of the detection-side mixer 23 is denoted as $\theta$. When a setting or adjustment is made so that the phase difference $\beta-\theta$ of the Lo input signal with respect to the RF input signal of the detection-side mixer 23 is:

$\beta-\theta=n\pi$ [rad] (n is an integer)

the ErrI output signal of the detection-side mixer 23, which represents the product of signals having $\beta-\theta$ phase difference, reaches a maximum.

At the differential amplifier 26 shown in FIG. 3, a reference voltage is applied to the non-inverted input terminals of the two operational amplifiers 26a and 26b, and the output voltages of the synchronizing detector 25 are applied to the inverted input terminals. Regarding which of the inverted or non-inverted input terminals the reference voltage and the detector output should be applied to, the design may be determined so that feedback is applied in a direction to decrease the control voltage according to whether the gain or phase shift increases or decreases when the control voltage for the gain or phase shift is raised. Furthermore, regarding loop filters 26c and 26d that are appended to the respective operational amplifiers 26a and 26b, they are designed so that the gain and phase shift feedback loops operate in a stable and rapid manner. The gain of the operational amplifiers 26a and 26b for error amplification may be switched so that at the initiation of control, such as when the power is turned on, the gain is increased to quicken the control speed, and when the control approaches convergence, the gain is decreased to stabilize the operation of the loop. The reference voltage is set according to the I component. detected output or the Q component detected output when the error of the gain or the phase shift is 0. The earlier example where the reference voltage=0 V is the case in which the I component detected output or the Q component detected output is 0 V when the error of the gain or the phase-shift is 0.

Figure 4:
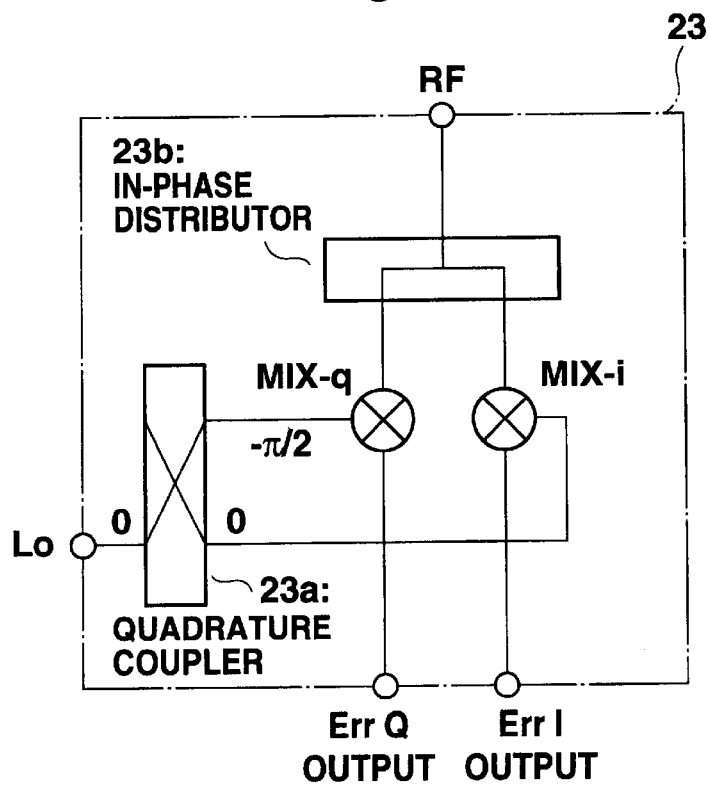
FIG. 4 is a block diagram showing a modified detection-side mixer.

In the detection-side mixer 23, as shown in FIG. 4, the same function can be also realized by exchanging an in-phase distributor 23b and a quadrature coupler 23a. Furthermore, MIX-I and MIX-Q of the synchronizing detector 25 need not be limited to double balanced mixers, and the synchronizing detection function can be realized with another method, such as a switching circuit. Furthermore, the narrow-band filter 24 need not even be for a narrow band depending on the settings of the pilot signal frequencies with respect to the operating band of the feed-forward amplifier.

Figure 5:
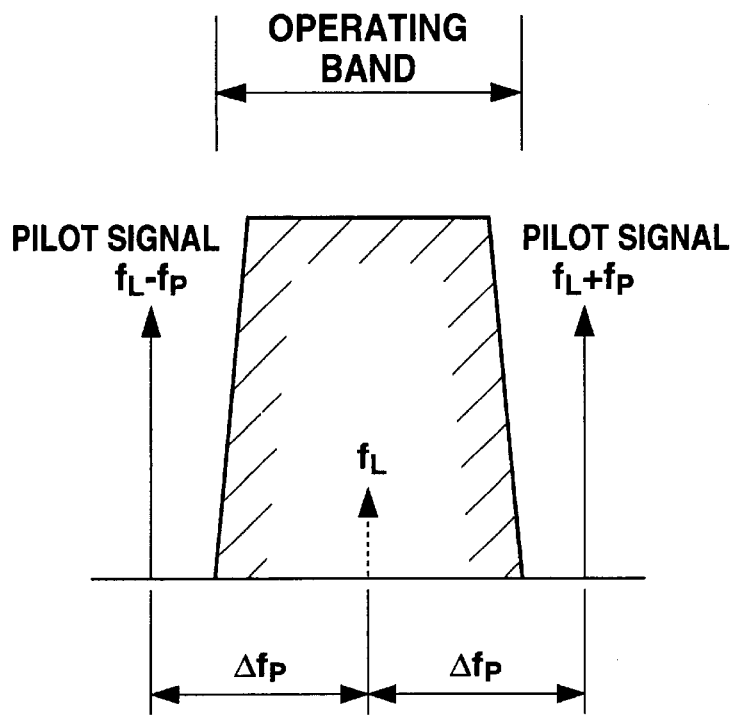
FIG. 5 shows an example of frequency allocation in the first embodiment of the present invention.

FIG. 5 shows an example of a frequency setting in the present embodiment. In the present embodiment, the frequency $f_L$ of the local oscillation signal is set substantially to the center of the frequency band of the signal to be amplified at the feed-forward amplifier. Furthermore, the frequency $f_P$ of the base pilot signal is set to a frequency (such as 6 MHz) higher than ½ of the operating bandwidth (such as 10 MHz) of the main amplifier 5. Therefore, the entire above-mentioned operating band lies between the upper-side pilot signal, which is the output of the sum frequency, and the lower-side pilot signal, which is the output of the difference frequency, both generated at the injection-side mixer 22. In the figure, $\Delta f_P$ denotes the frequency difference between the upper-side and lower-side pilot signals with respect to the local oscillation signal, and is self evidently equal to frequency $f_P$.

Figure 6:
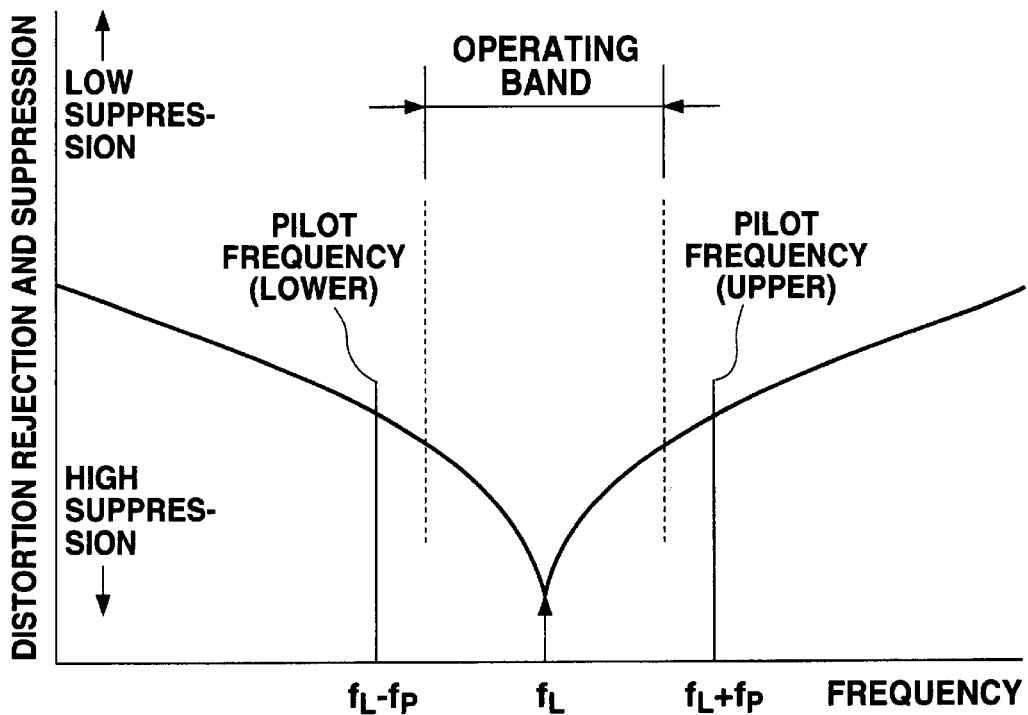
FIG. 6 shows the distortion component rejection and suppression effect under the frequency allocation shown in FIG. 5.

Under this sort of frequency setting, when the feed-forward amplifier shown in FIG. 1 is operated and optimum control of the distortion rejection loop (and distortion detection loop) is executed, automatic control of the gain and phase shift is performed as a result so as to enhance only the distortion component rejection and suppression effect with regard to the two frequencies where the upper-side and lower-side pilot signals appear. Thus, as shown in FIG. 6, the distortion component rejection and suppression effect becomes most significant at a frequency substantially at the center between the upper-side pilot signal (referred to as "upper" in the figure) and the lower-side pilot signal (referred to as "lower" in the figure). Namely, the frequency at which the distortion component rejection and suppression effect is most significant is at, or in the vicinity of, frequency $f_L$ of the local oscillation signal. As a result, a satisfactory control state (low distortion state) compared to the prior art is obtained in general over the entire operating band of the feed-forward amplifier.

Therefore, according to the present embodiment, the distortion component rejection and suppression effect in the operating band of the feed-forward amplifier can be increased more reliably and effectively, and a low-distortion output signal having higher quality can be obtained than in the prior art in which the second pilot signal of a single frequency is used. Furthermore, the upper-side and lower-side pilot signals are generated by up-converting the base pilot signal using a local oscillation signal, while the residual pilot signals are detected by down-converting the low-distortion output signal using the same local oscillation signal that is used in the up-conversion. Thus, in spite of the fact that two types of second pilot signals are injected, the reduced number of oscillators, mixers, and detectors simplifies the circuit configuration to yield low cost and low power consumption.

Furthermore, in the present embodiment, the base pilot signal for up-conversion is used as the reference signal Ref at the synchronizing detector 25, and the local oscillation signal that was used for up-conversion is also used for down-conversion. Therefore, even if the oscillation frequency of the oscillators 20 and 21 fluctuates, the control signal generation operation based on synchronizing detection executes normally provided that the fluctuations are not extremely large. Namely, the control signal generation operation based on synchronizing detection executes normally provided the frequencies of the upper-side and lower-side pilot signals do not deviate from the pass band of the narrow-band filter 24 and the frequency of the base pilot signal does not deviate from the acceptable band of the synchronizing detector 25. Therefore, when configuring the oscillators 20 and 21, since it is not necessary to use oscillating elements that have high thermal stability but are high in cost, as well as oscillators that have high thermal stability but are complex in configuration, the present embodiment is suitable for a low cost, small size, and lightweight implementation.

Furthermore, since it is not necessary to execute the step-by-step search process using a CPU or the like and since control signals can be generated simultaneously and concurrently for both the gain and phase shift, the time required to (re)establish an optimum control state is shorter than in the prior art, and unnecessary radiation such as spurious caused by distortion components and the second pilot signal are less likely to occur.

Additionally, since the down-converted signal is filtered at the narrow-band filter 24, the selectivity of this narrow-band filter 24 can be made higher compared to the narrow-band filter 15 of the prior art, and thus the precision of detecting the remaining amount of the second pilot signal, and in turn the stability of controlling the distortion rejection loop, can also be enhanced.

Depending on the performance of the injection-side mixer 22, the base pilot signal and the local oscillation signal to be mixed could leak from the output terminal of the injection-side mixer 22 and are injected into the main signal together with the upper-side and lower-side pilot signals. In the present embodiment, the leakage of the base pilot signal and the local oscillation signal does not deteriorate the quality of the low-distortion oscillation signal. Firstly, as the local oscillation signal has a frequency equal to or close to the frequency where the distortion rejection and suppression effect reaches a maximum, the leaked local oscillation signal, as well as the distortion components, undergo preferred rejection and suppression. Second, by setting the frequency of the base pilot signal to have sufficient difference with the frequency of the local oscillation signal, the leakage of the base pilot signal from the injection-side mixer 22 can be rejected or suppressed by a not-shown filter disposed between the injection-side mixer 22 and the pilot signal injection point in the feed-forward amplifier.

Figure 7:
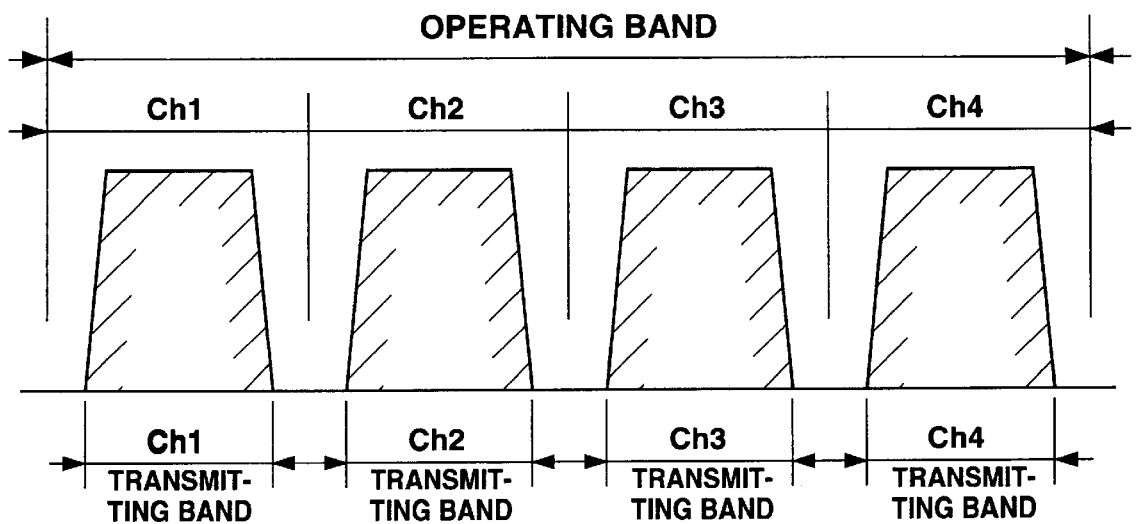
FIG. 7 shows an example of channel allocation.

Furthermore, it is assumed that there is a plurality of channels as shown in FIG. 7, and the feed-forward amplifier of the present embodiment is used for a certain channel. If it became necessary to change the settings for another channel, the present embodiment can be adapted simply by changing the oscillation frequency of the oscillator 21. Namely, it has excellent versatility with respect to channel changes.

Although the gain adjustment circuit 8 and the phase adjustment circuit 9 are provided in the distortion rejection loop in the present embodiment, a vector adjustment circuit, such as a quadrature modulator, may be provided instead. Alternatively, the gain adjustment circuit 8 and the phase adjustment circuit 9 may be transposed, or the gain adjustment circuit 8 and the phase adjustment circuit 9 may be provided between the stages of the amplifier circuits forming the sub-amplifier 10. Similarly, the vector adjustment circuit in the distortion detection loop may be a circuit for adjusting the combination of gain and phase. Although the oscillator 20 for generating the base pilot signal and the oscillator 21 for generating the local oscillation signal are provided, the base pilot signal and the local oscillation signal may be input from an external source or may be generated from signals that are input from an external source.

Figure 8:
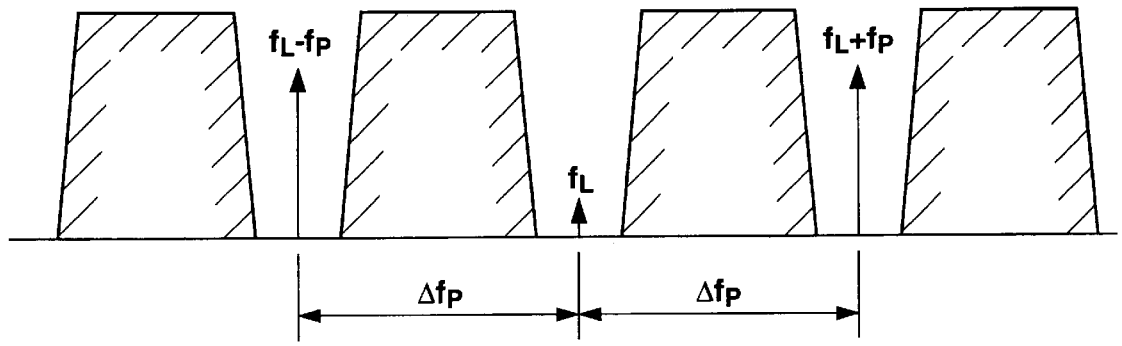
FIG. 8 shows an example of frequency allocation in the first embodiment of the present invention that can be adopted under the channel allocation shown in FIG. 7.
Figure 9:
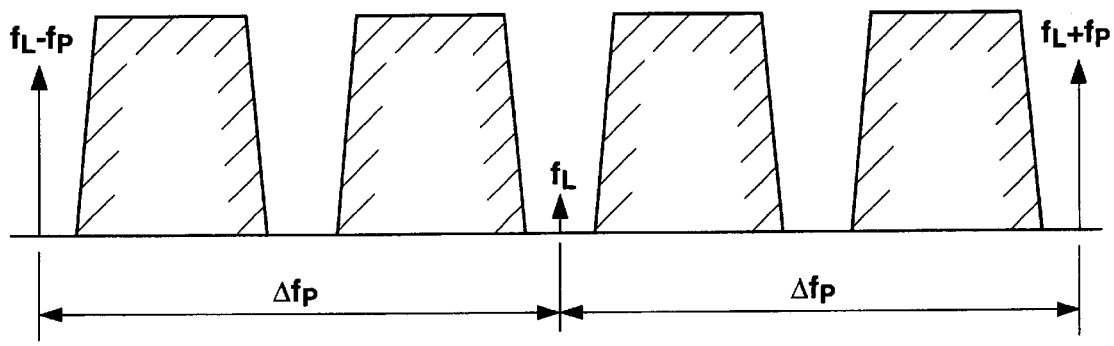
FIG. 9 shows another example of frequency allocation in the first embodiment of the present invention that can be adopted under the channel allocation shown in FIG. 7.

Furthermore, the frequency allocation is not limited to the allocation shown in FIG. 5. For example, if the input signal to the main amplifier 5 has the four channels of ch1 to ch4 as shown in FIG. 7, the frequency $f_L$ of the local oscillation signal may be placed in the guard band separating the second channel ch2 and the third channel ch3, and the frequency $f_P$ of the base pilot signal is made the channel bandwidth (FIG. 8) or twice the channel bandwidth (FIG. 9) so as to yield a relatively high distortion rejection and suppression effect over the channels ch1 to ch4. This sort of frequency allocation is desirable when realizing a feed-forward amplifier for simultaneously amplifying a plurality of channels at the transmitter relating to a communications standard having a plurality of channels.

Figure 10:
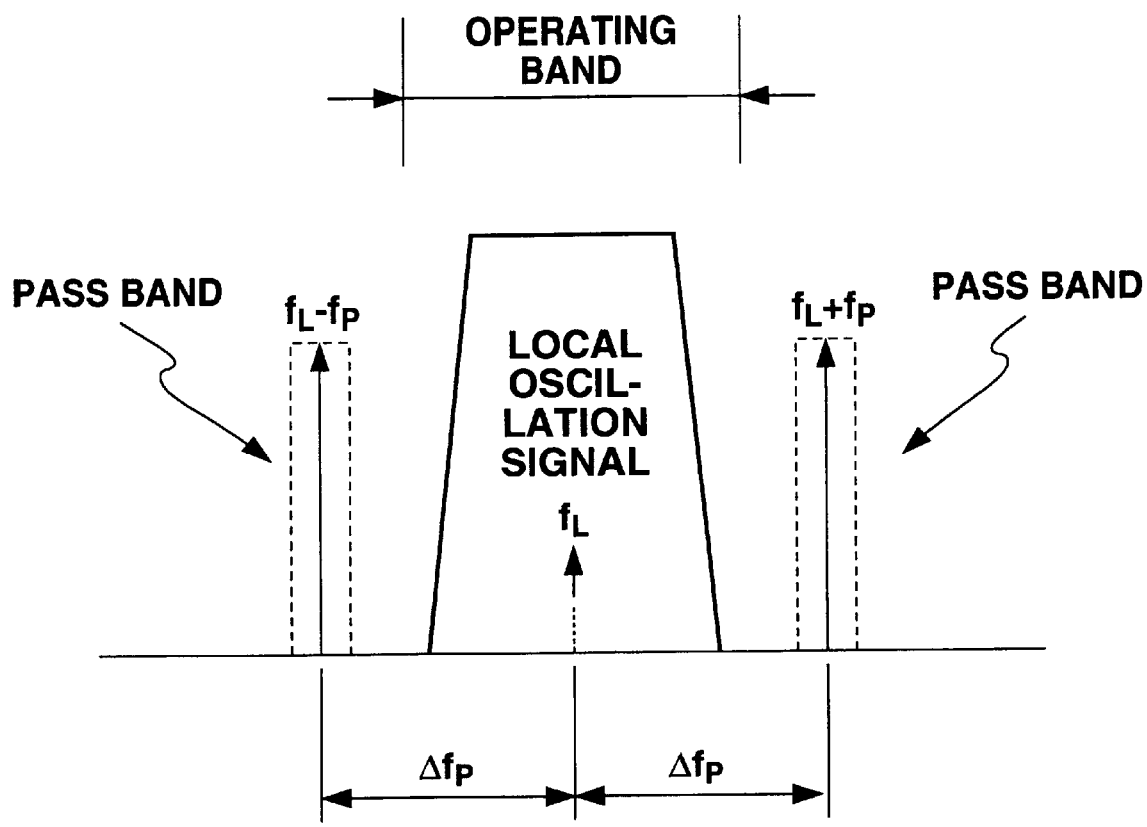
FIG. 10 shows the principle of separation and extraction of the upper-side and lower-side pilot signals.
Figure 11:
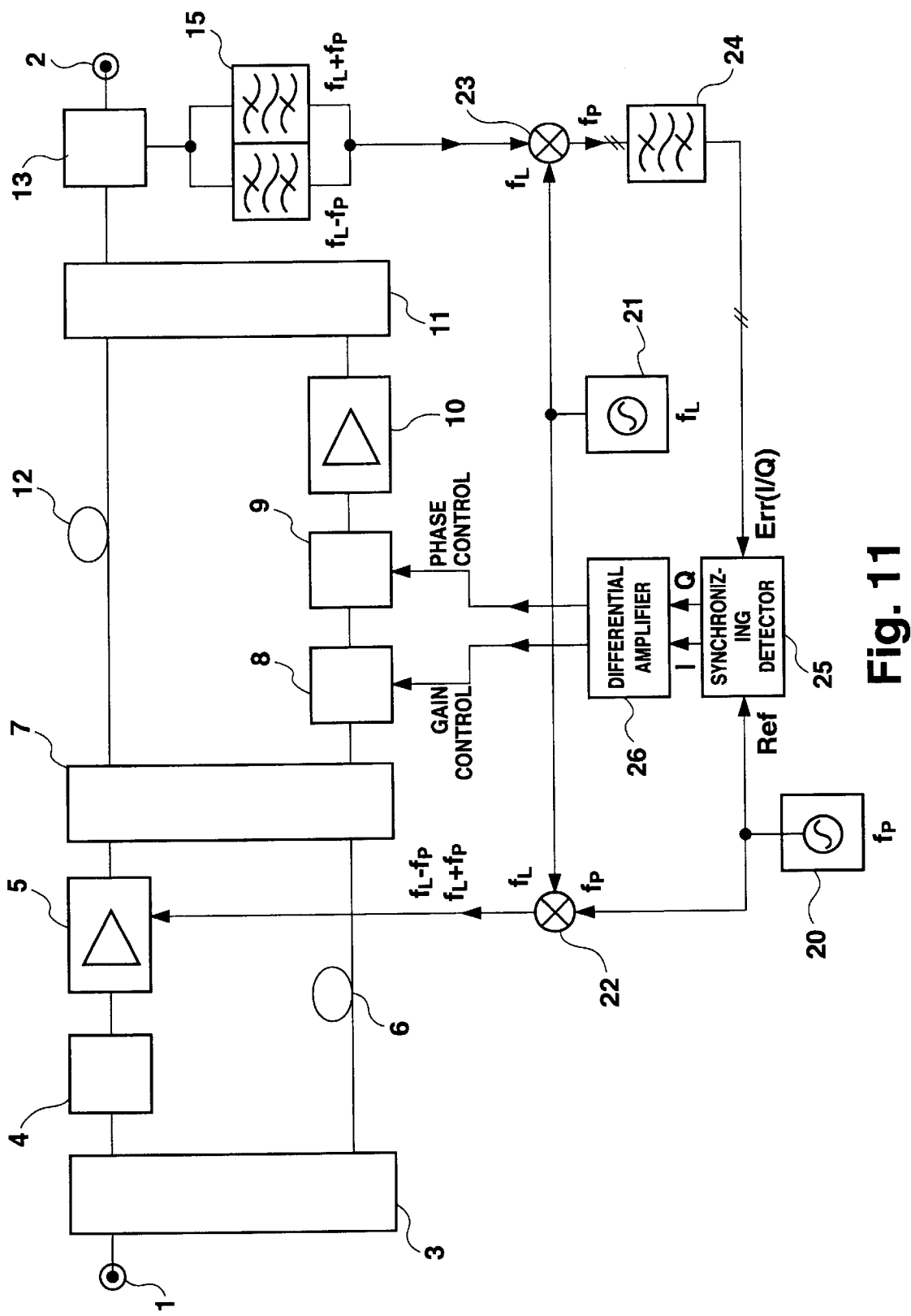
FIG. 11 is a block diagram showing a modified first embodiment of the present invention.

In the case where the two pilot signal frequencies are set so as to be sufficiently separated with respect to the operating band, as shown in FIG. 10, namely the frequency difference between the main signal and the pilot signals is large enough to separate them from each other by using a narrow-band filter, it is preferable to provide the narrow-band filters 15 with center frequencies of $f_L-f_P$ and $f_L+f_P$ respectively between the distributor 13 and the detection-side mixer 23 as shown in FIG. 11, to reject the main signal and to supply only the residual pilot signals to the detection-side mixer 23.

Figure 12:
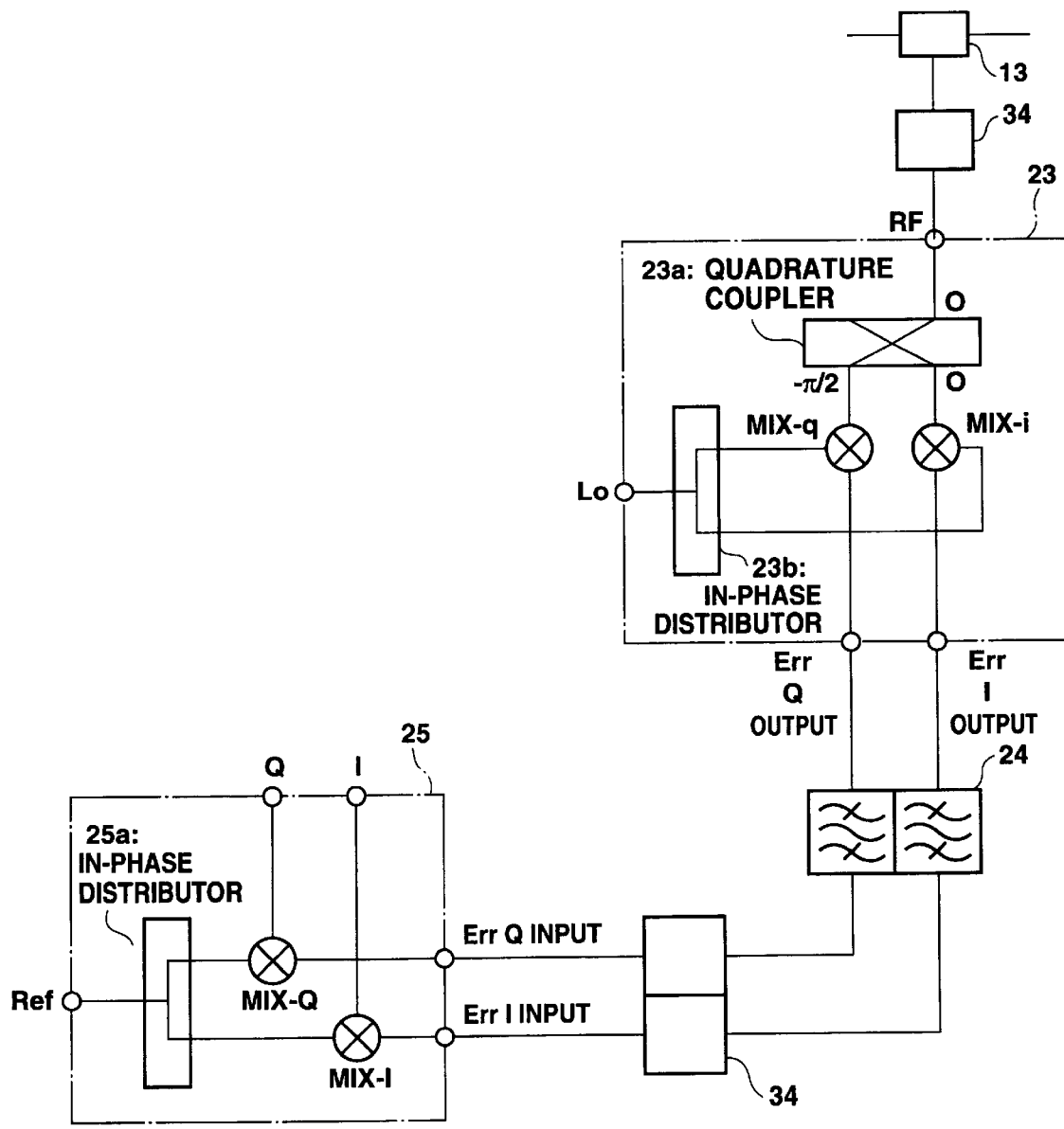
FIG. 12 is a block diagram showing a modified first embodiment of the present invention.
Figure 13:
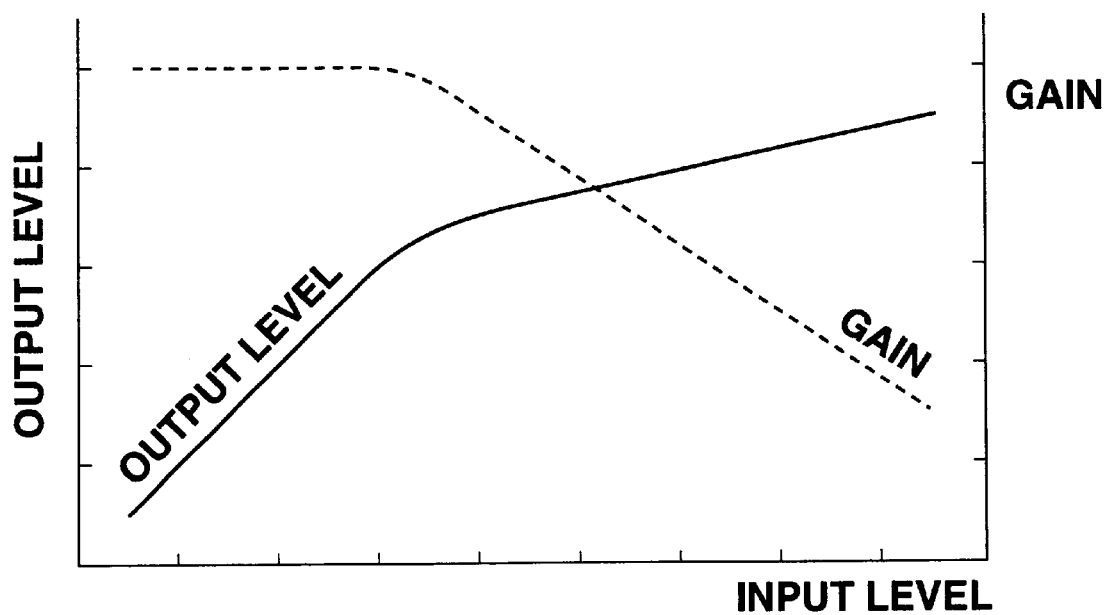
FIG. 13 shows an example of characteristics of the AGC circuit in FIG. 12.

Furthermore, an AGC (automatic gain control) circuit 34 with characteristics shown in FIG. 13 is provided between the distributor 13 and the detection-side mixer 23, or in the ErrI and ErrQ signal paths between the detection-side mixer 23 and the synchronizing detector 25 as shown in FIG. 12 so that the dynamic range of the error signal detection can be expanded. As shown in FIG. 13, when the input level is high, namely, when the output level of the distributor 13 or the output level of the detection-side mixer 23 is high, the AGC circuit 34 lowers the gain so that an excessive input is not fed to the detection-side mixer 23 or the synchronizing detector 25, and when the output level of the distributor 13 or the detection-side mixer 23 is low, the AGC circuit 34 operates at maximum gain so that error signals of a sufficient level are supplied to the detection-side mixer 23 and the synchronizing detector 25.

(2) Second through Fourth Embodiments

Figure 14:
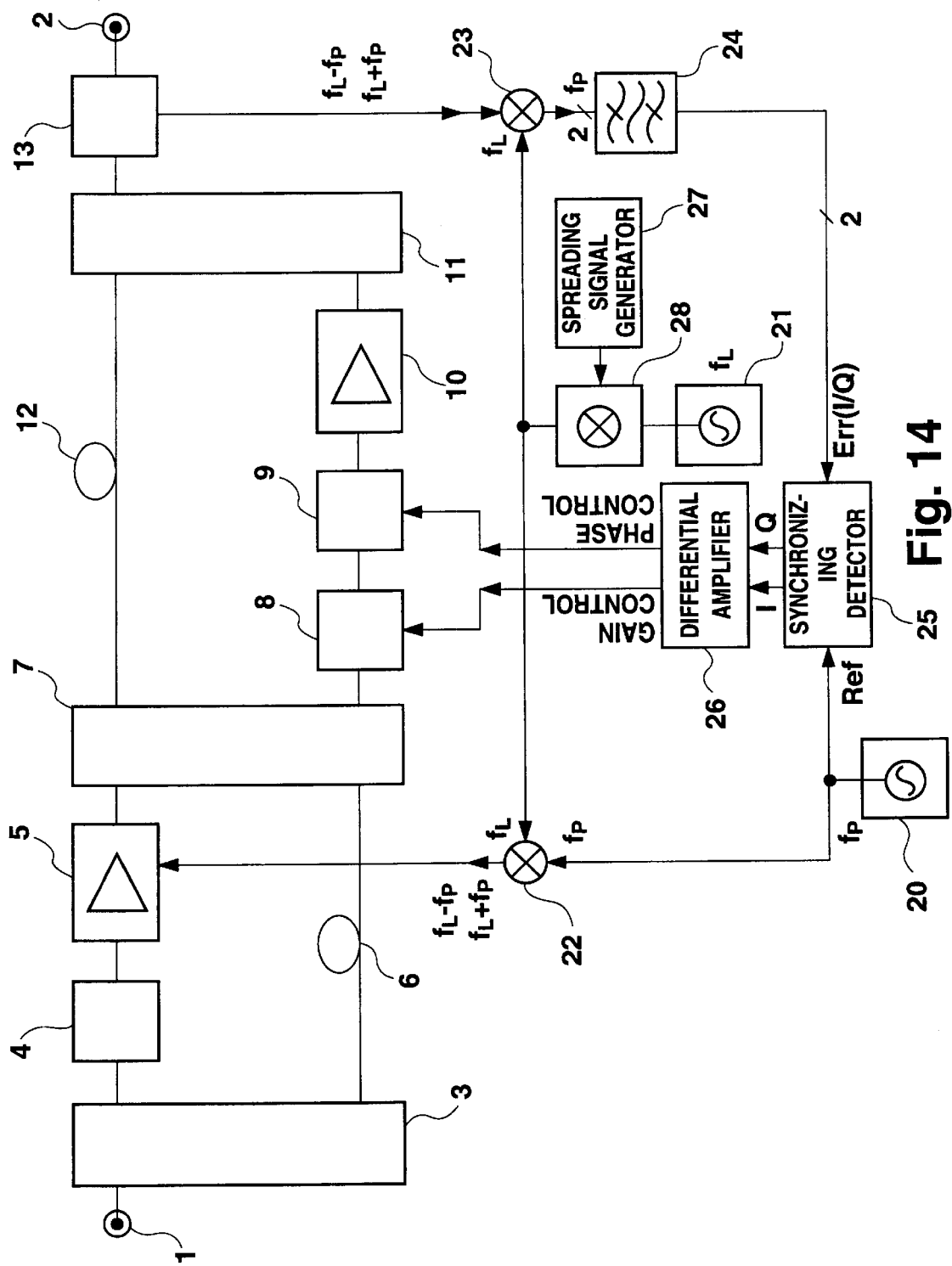
FIG. 14 is a block diagram of the feed-forward amplifier according to a second embodiment of the present invention.
Figure 15:
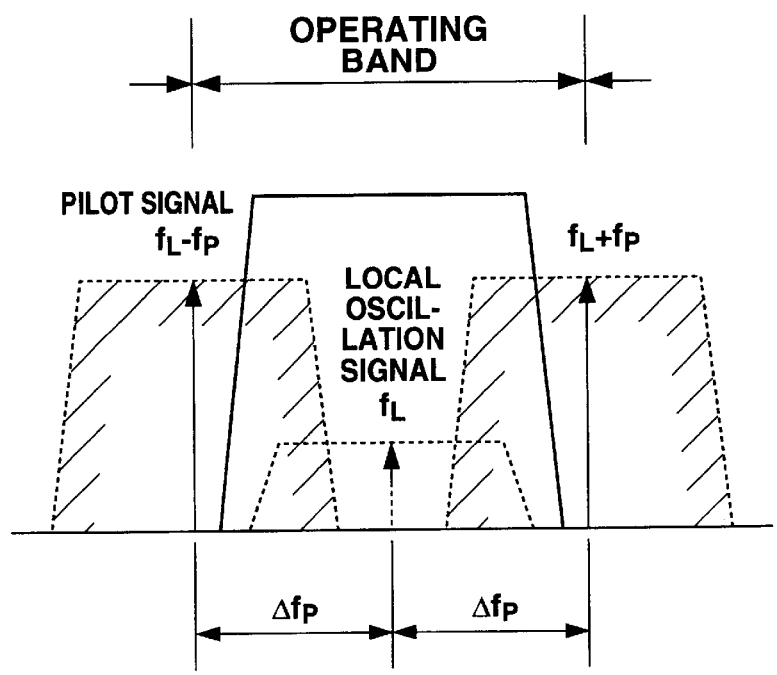
FIG. 15 shows an example of the frequency allocation in the second embodiment of the present invention.

FIG. 14 shows a configuration of the feed-forward amplifier according to the second embodiment of the present invention. In the present embodiment there are provided a spreading signal generator 27 for generating a spreading signal representing a predetermined code sequence, and a modulator 28 using this spreading signal to perform spread spectrum modulation on the output from the oscillator 21 to the injection-side mixer 22 and the detection-side mixer 23. Therefore, the spectrum of the local oscillation signal that is supplied to the injection-side mixer 22 and the detection-side mixer 23 in the present embodiment is spread within a band having a certain significant bandwidth as shown in FIG. 15. The upper-side and lower-side pilot signals and their residual component spectrums in the low-distortion output signal are also spread as shown in the same figure. FIG. 15 is an example (also FIG. 17 to be given hereinafter) in the case where the frequency allocation of the local oscillation signal and the base pilot signal with respect to the operating band of the main amplifier 5 has the same frequency allocation as shown in FIG. 5. In the present embodiment, since the spectrum of the local oscillation signal that is supplied to the detection-side mixer 23 is spread, despreading is performed simultaneously with the demodulation of the signal having frequency $f_P$ by the down-conversion by the detection-side mixer 23.

Figure 16:
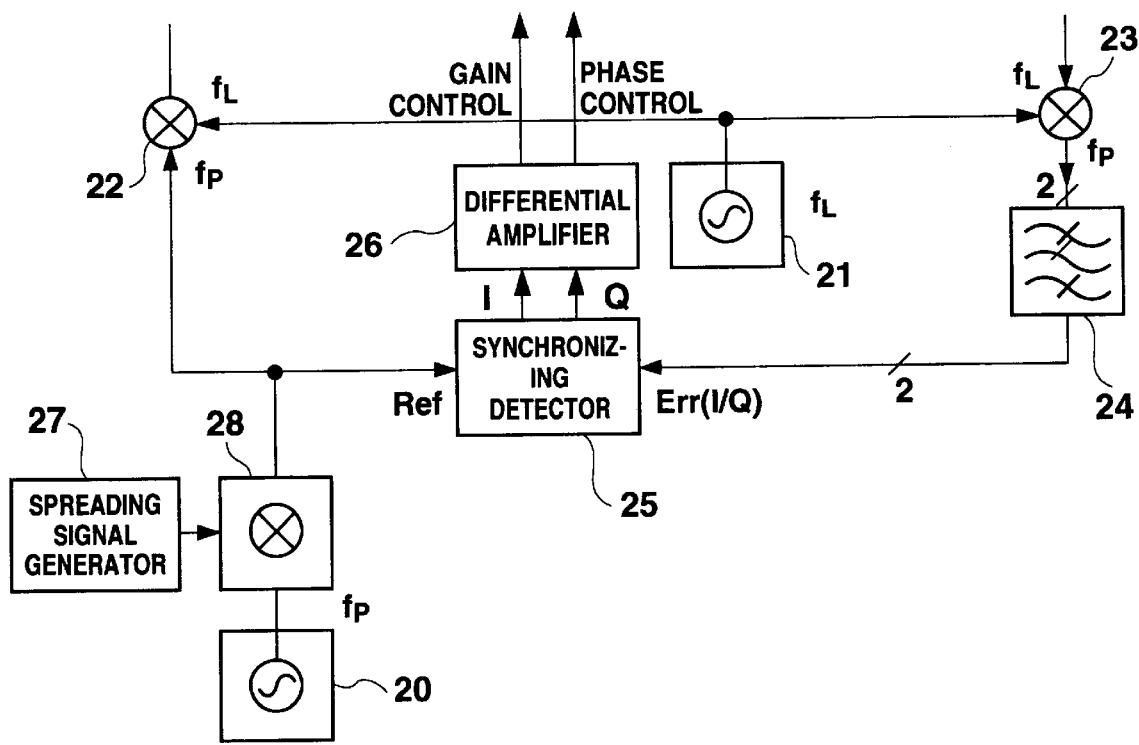
FIG. 16 is a block diagram showing the major components of the feed-forward amplifier according to a third embodiment of the present invention.
Figure 17:
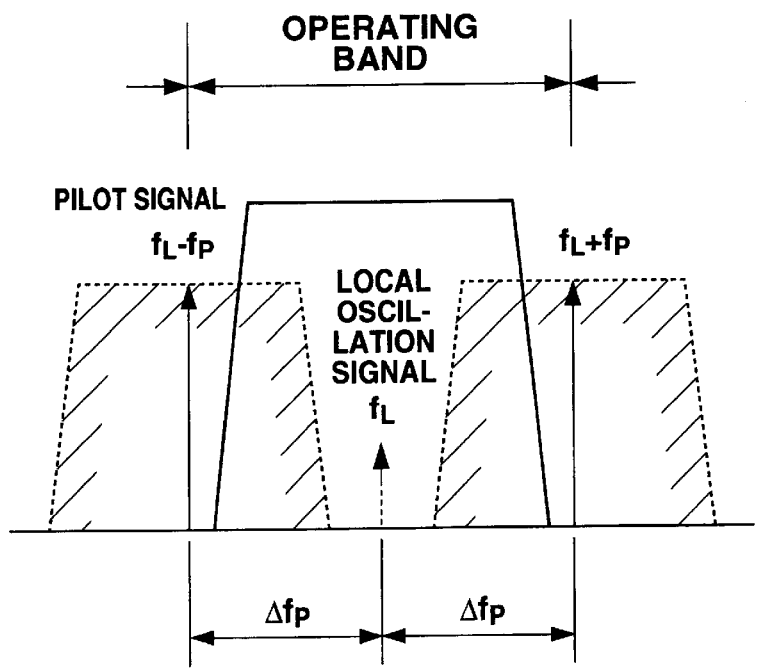
FIG. 17 shows an example of the frequency allocation in the third embodiment of the present invention.

FIG. 16 shows the configuration of the feed-forward amplifier according to the third embodiment of the present invention, and particularly the part differing from the second embodiment. In the present embodiment there are provided the spreading signal generator 27 for generating the spreading signal representing a predetermined code sequence, and the modulator 28 using this spreading signal to perform spread spectrum modulation on the output from the oscillator 20 to the injection-side mixer 22 and the synchronizing detector 25. Therefore, the spectrum of the base pilot signal that is supplied to the injection-side mixer 22-and the detection-side mixer 23 is spread within a band having a certain significant bandwidth, and accordingly, the upper-side and lower-side pilot signals and their residual component spectrum in the low-distortion output signal are also spread as shown in FIG. 17.

Figure 18:
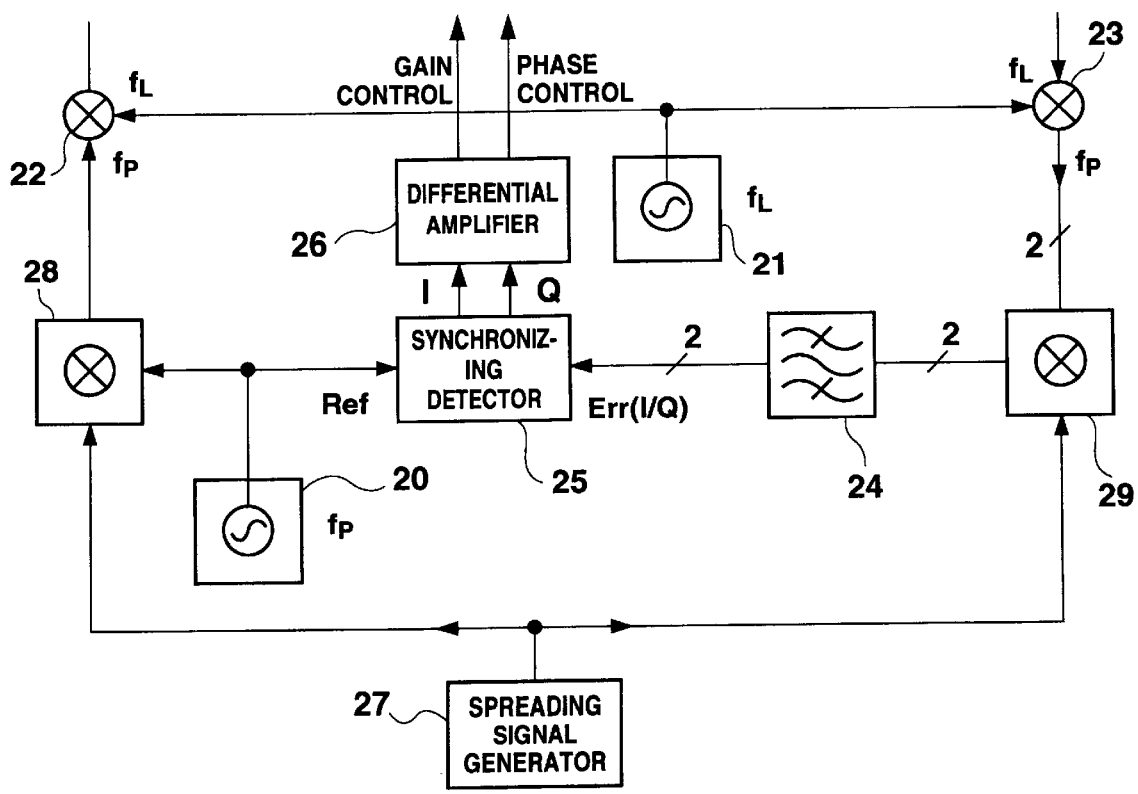
FIG. 18 is a block diagram showing the major components of the feed-forward amplifier according to a fourth embodiment of the present invention.

FIG. 18 shows the configuration of the feed-forward. amplifier according to the fourth embodiment of the present invention, and particularly the part differing from the second and third embodiments. In the present embodiment there are provided the spreading signal generator 27 for generating the spreading signal representing a predetermined code sequence, the modulator 28 for performing spread spectrum modulation on the output from the oscillator 20 to the injection-side mixer 22 using the spreading signal, and modulators 29 for performing despread spectrum modulation on the outputs of the detection-side mixer 23 using the above-mentioned spreading signal. Although one modulator 29 is shown in FIG. 18, one is necessary for each of the error signals ErrI and ErrQ. Therefore, the spectrum of the base pilot signal that is supplied to the injection-side mixer 22 and the detection-side mixer 23 in the present embodiment is spread within a band having a certain significant bandwidth, and accordingly, the upper-side and lower-side pilot signals and their residual component spectrum in the low-distortion output signal are also spread as shown in FIG. 17. The spectrum of the error signals ErrI and ErrQ that are input to the synchronizing detector 25 is despread, contrary to the third embodiment in which the spread spectrum modulated error signals ErrI and ErrQ are input.

In these second through fourth embodiments, the spectrum of the upper-side and lower-side pilot signals that are injected are spread. Namely, the upper-side and lower-side pilot signals act as noise with respect to the signal (main signal) to be amplified and output. If the characteristics of the distortion rejection loop are at or near an optimum state, these pilot signal components are rejected in the same manner as the distortion components. Therefore, the upper-side and lower-side pilot signals do not adversely affect the main signal even though part of the spectrum of the upper-side and lower-side pilot signals enters the operating band of the feed-forward amplifier as shown in FIG. 15 or FIG. 17.

Furthermore, the fact that part of the spectrum of the upper-side and lower-side pilot signals is within the operating band of the feed-forward amplifier signifies that the increase in the distortion component rejection and suppression effect within the operating band as described earlier with reference to FIGS. 5 and 6 can be obtained with more certainty.

Additionally, in the third embodiment, it is necessary to set the pass bandwidth of the narrow-band filter 24 in accordance with the spread bandwidth of the upper-side and lower-side pilot signals. On the contrary, in the second and fourth embodiments, since the signal that was despread spectrum modulated is filtered, the pass bandwidth of the narrow-band filter 24 may be set narrow, the as same as that in the first embodiment, and narrower than in the third embodiment. Namely, better selectivity of the narrow-band filter 24, and precise detection by the synchronizing detector 25, and in turn higher stability of the control may be achieved in the second and fourth embodiments.

It should be noted that although in the second through fourth embodiments the oscillation output of either the oscillator 20 or oscillator 21 is spread spectrum modulated, the circuit may be configured so that both outputs are spread spectrum modulated. Namely, it is also possible to replace the oscillator 20 in FIG. 14 with the oscillator 20, the spreading signal generator 27, and the modulator 28 shown in FIG. 16 so that both outputs are spread spectrum modulated.

(3) Fifth and Sixth Embodiments

Figure 19:
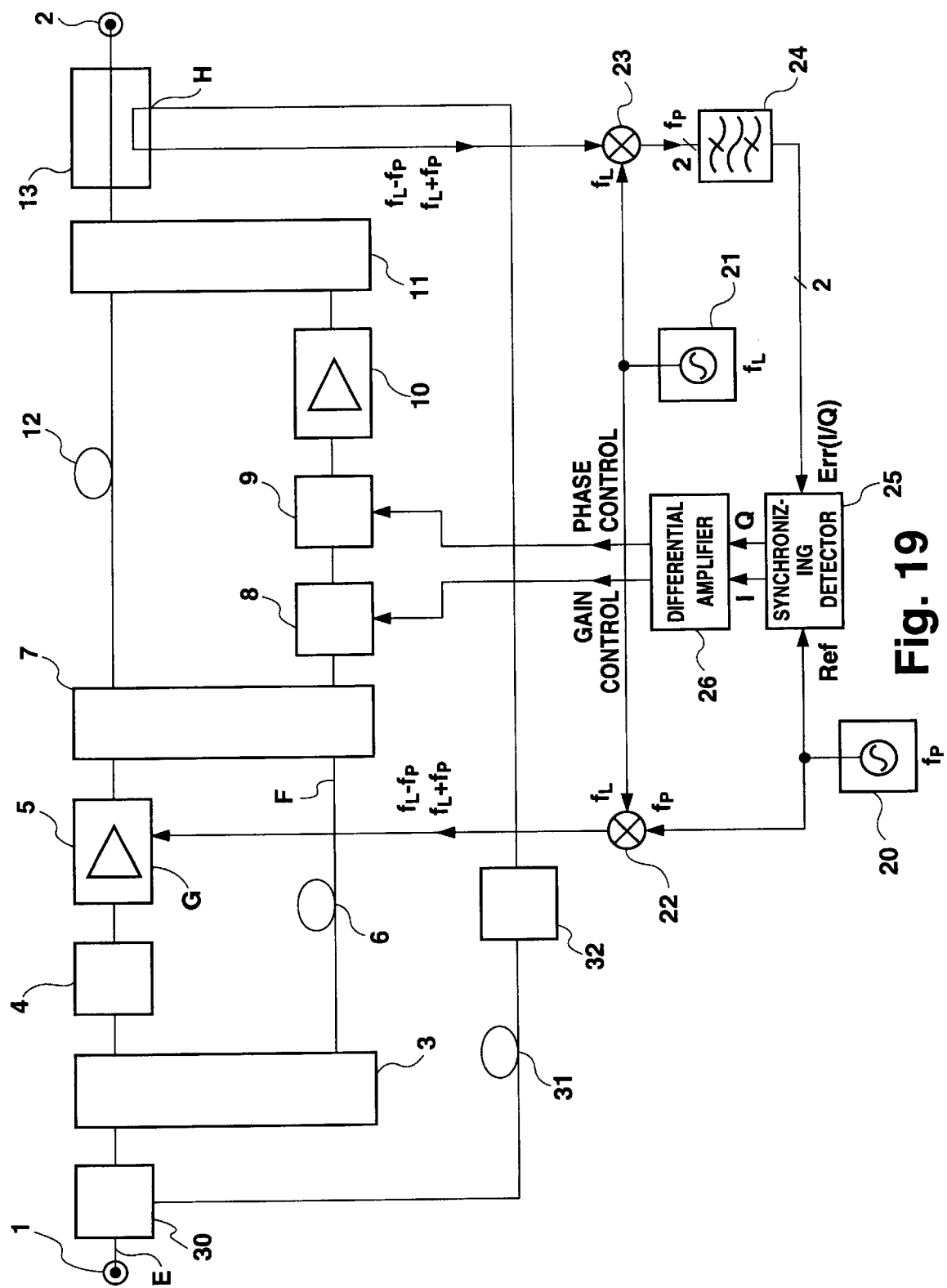
FIG. 19 is a block diagram showing a configuration of the feed-forward amplifier according to a fifth embodiment of the present invention.

FIG. 19 shows the configuration of the feed-forward amplifier according to the fifth embodiment of the present invention. In the present embodiment, a distributor 30 provided between the input terminal 1 and the distributor 3 branches part of the input signal, and the branched input signal is supplied to the distributor 13 via a delay circuit 31 and a vector adjustment circuit 32. The distributor 13 in the present embodiment is preferably configured from a directional coupler, and couples part of the low-distortion output signal that is supplied from the directional coupler 11 with the branched input signal that is received from the distributor 30. The signal that results is supplied to the detection-side mixer 23.

Figure 20:
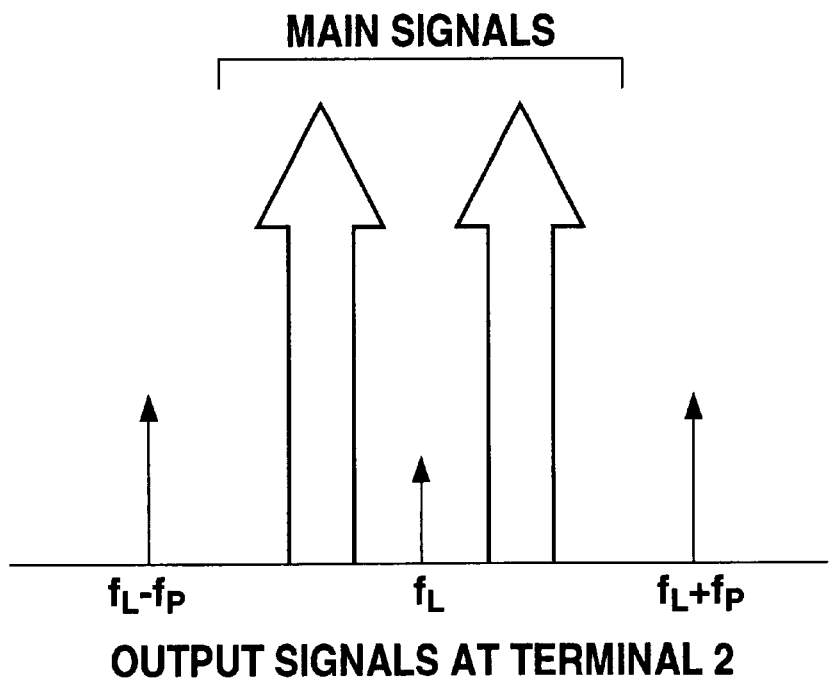
FIG. 20 shows an example of the frequency allocation in the fifth embodiment of the present invention.

As conceptually shown in FIG. 20, the low-distortion output signal appearing at the output terminal 2 in the embodiments described above includes output components (referred to as "main signals" in the figure) corresponding to the signals to be amplified at the feed-forward amplifier, and, when the operation of the distortion rejection loop is not optimized, also the local oscillation signal that has leaked from the injection-side mixer 22 and the remaining upper-side and lower-side pilot signals. Furthermore, the level of the main signals is higher than the level of the upper-side and lower-side pilot signals. This is because the main signals appearing at the output terminal 2 are amplified signals, the upper-side and lower-side pilot signals are set at levels lower than the main signals to suppress the intermodulation distortion between the main signals and the pilot signals, and the upper-side and lower-side pilot signals remaining in the low-distortion output signal decrease as the state of the distortion rejection loop approaches an optimum state. The main signals having this high level act as noise or unnecessary components adversely affecting operation, on the circuits from the detection-side mixer 23 to the synchronizing detector 25 for detecting the residual upper-side and lower-side pilot signals.

Figure 21:
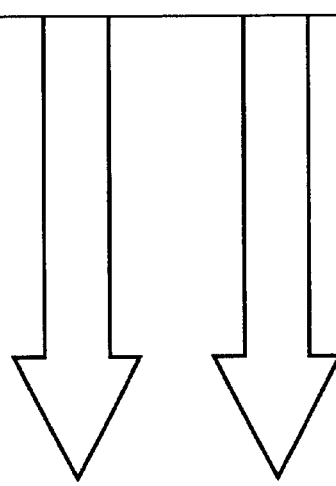
FIG. 21 shows input signals that are fed forward in the fifth embodiment of the present invention.
Figure 22:
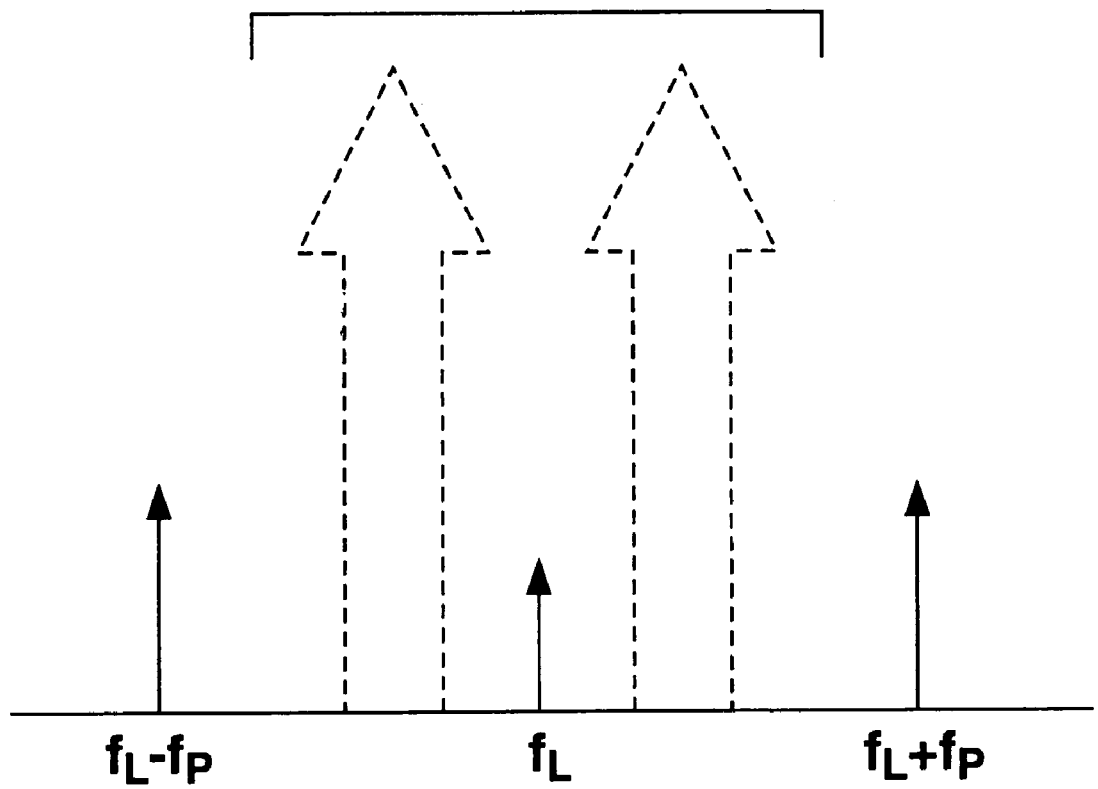
FIG. 22 shows the main signal cancellation principle in the fifth embodiment of the present invention.

To prevent this problem, using the input signal branched by the distributor 30, the main signal components are rejected from the signal that is input to the detection-side mixer 23 in the present embodiment. Namely, after delay time compensation by the delay circuit 31, and I and Q component value adjustment (or amplitude and phase adjustment) by the vector adjustment circuit 32 are performed, the input signal (refer to FIG. 21) branched by the distributor 30 is fed forward to one of the input terminals (denoted as "H" in the figure) of the distributor 13 so as to cancel (refer to FIG. 22) the "main signal" components in the signal that is supplied from the distributor 13 to the detection-side mixer 23. As a result,the residual pilot signals, in spite of their low levels, can be preferably detected to realize more accurate and precise control. The input dynamic range of the detection-side mixer 23 may be set to be narrow, since the high level main signals are not input.

To cancel the main signals successfully, the delay time of the delay circuit 31 is set to be equal to the delay time created in the path from the signal branch point within the distributor 30 to the signal coupling point within the distributor 13 via the main amplifier 5 and the delay circuit 12. The adjustment in the vector adjustment circuit 32 is set so that the two kinds of signals (main signals in FIG. 20 and main signals in FIG. 21) to be coupled have the same amplitude and opposite phase at the signal coupling point within the distributor 13, or if necessary, a circuit is provided to variably control the adjustment so that such an amplitude and phase relationship is established.

Figure 23:
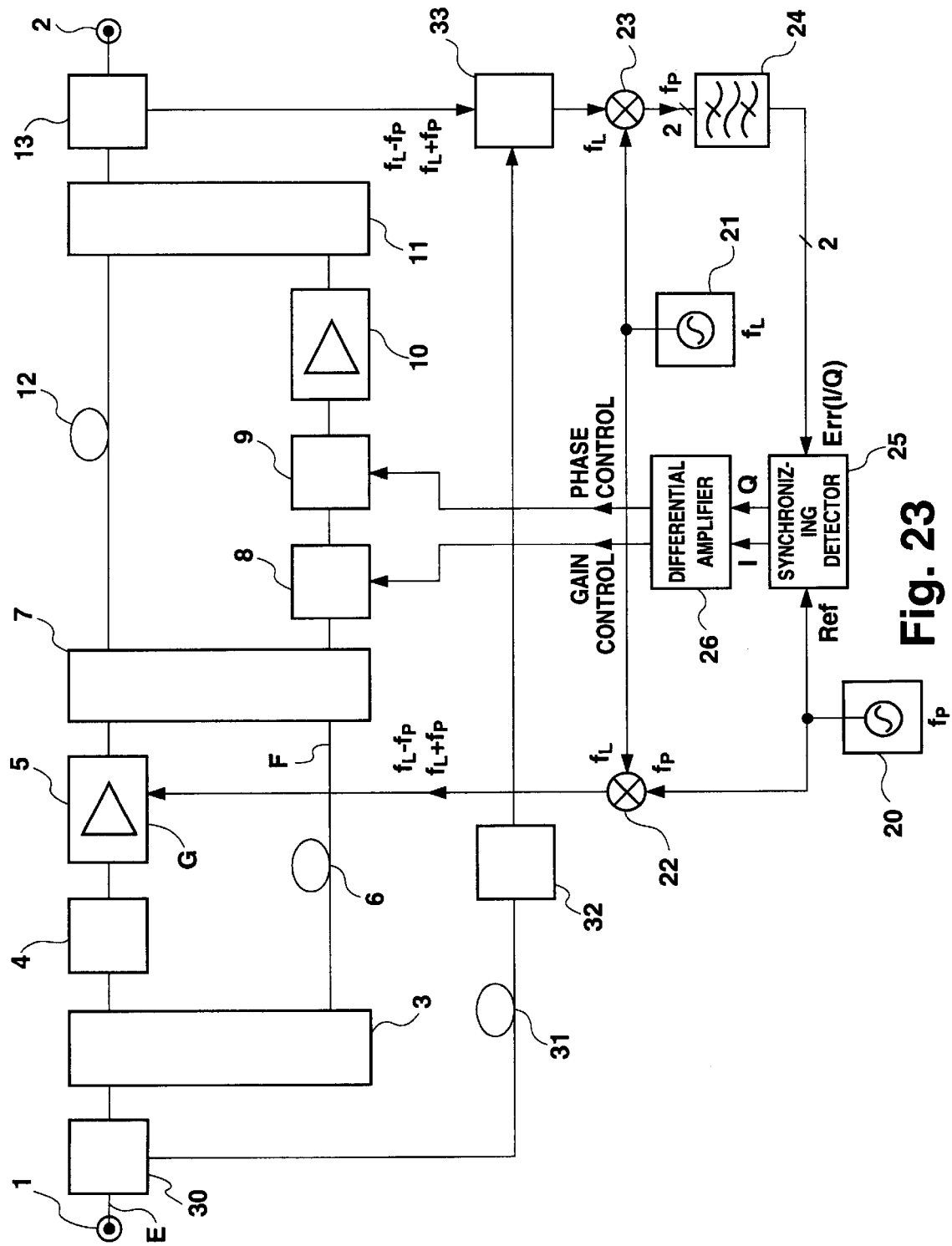
FIG. 23 is a block diagram showing a configuration of the feed-forward amplifier according to a sixth embodiment of the present invention.

FIG. 23 shows the configuration of the feed-forward amplifier according to the sixth embodiment of the present invention. As in the fifth embodiment, the present embodiment comprises a circuit for rejecting and suppressing the main signal components in the input from the distributor 13 to the detection-side mixer 23. However, whereas the fifth embodiment achieves its object by using the directional coupler having an appropriate coupling as the distributor 13, the present embodiment achieves its object by providing a separate coupler 33 between the distributor 13 and the detection-side mixer 23. The coupler 33 couples the signal that is supplied from the distributor 13 and the signal that is supplied via the delay circuit 31 and the vector adjustment circuit 32 from the distributor 30, and supplies the signal that is obtained as a result to the detection-side mixer 23.

FIGS. 24 to 29 show modifications of the fifth and sixth embodiments. In these figures, only the distributor 30 and its periphery are shown for simplicity. When implementing the fifth and sixth embodiments, the location where the distributor 30 is provided, namely, the location where the signal to be fed forward is extracted to cancel the main signal components, can be selected from a number of locations. The signal can be extracted at locations where the signal includes the main signal but does not include the upper-side and lower-side pilot signals, such as a point on the path from point E to point F in FIG. 19, a point on the path from point E to point G, and so forth.

Figure 24:
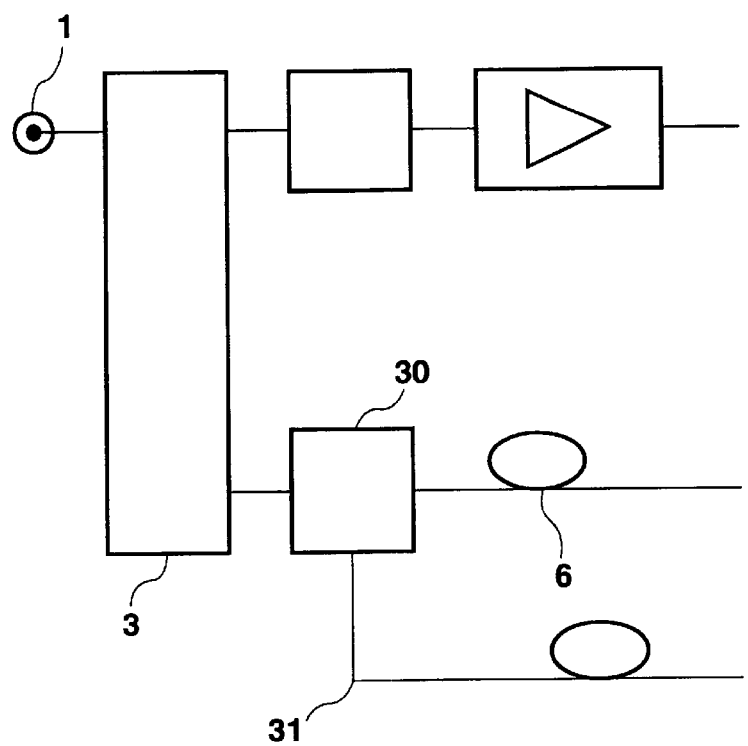
FIG. 24 shows a partially modified fifth and sixth embodiment of the present invention.
Figure 25:
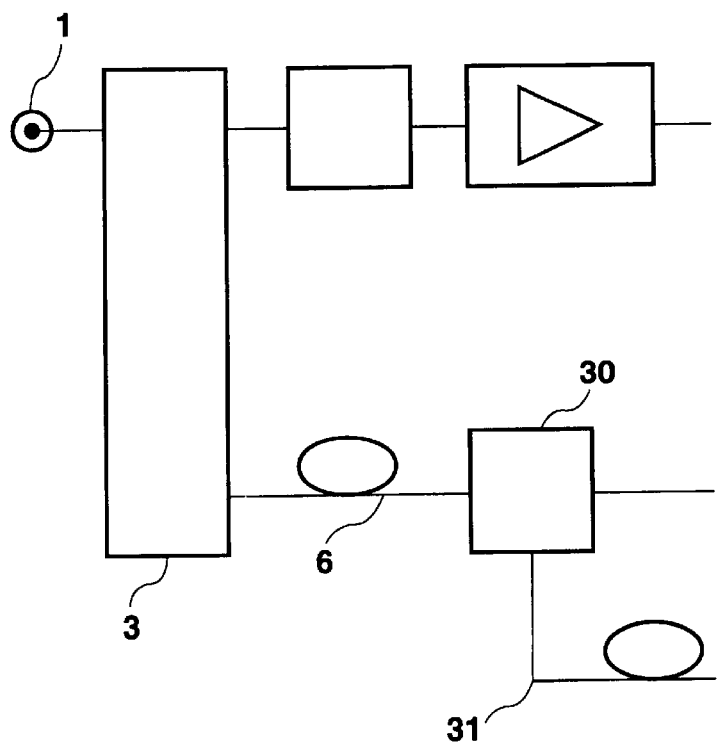
FIG. 25 shows a partially modified fifth and sixth embodiment of the present invention.

In the examples shown in FIGS. 24 and 25, the distributor 30 is provided on the path from the distributor 3 to the directional coupler 7 via the delay circuit 6. As clearly shown in both figures, there is no constraint in implementation on the order of arrangement of the delay circuit 6 and the distributor 30. However, the delay time of the delay circuit 31 can be shortened in FIG. 24 compared to FIGS. 19 and 23, or in FIG. 25 compared to FIG. 24. When the delay circuit 31 is implemented as a delay line, the length of the delay line can be shortened if the delay tie is short, thus leading to a small and lightweight implementation. Although the sixth embodiment modified according to the illustration of FIG. 25 appears at first glance to have a configuration similar to the feed-forward amplifier described in Japanese Patent Laid-Open Publication No. Hei 11-177351, the configuration described in this publication aims to avoid the second pilot signal. Therefore, the concept of allowing easy detection of the second pilot signal embedded in the main signal is not in any way disclosed or suggested in this publication.

Figure 26:
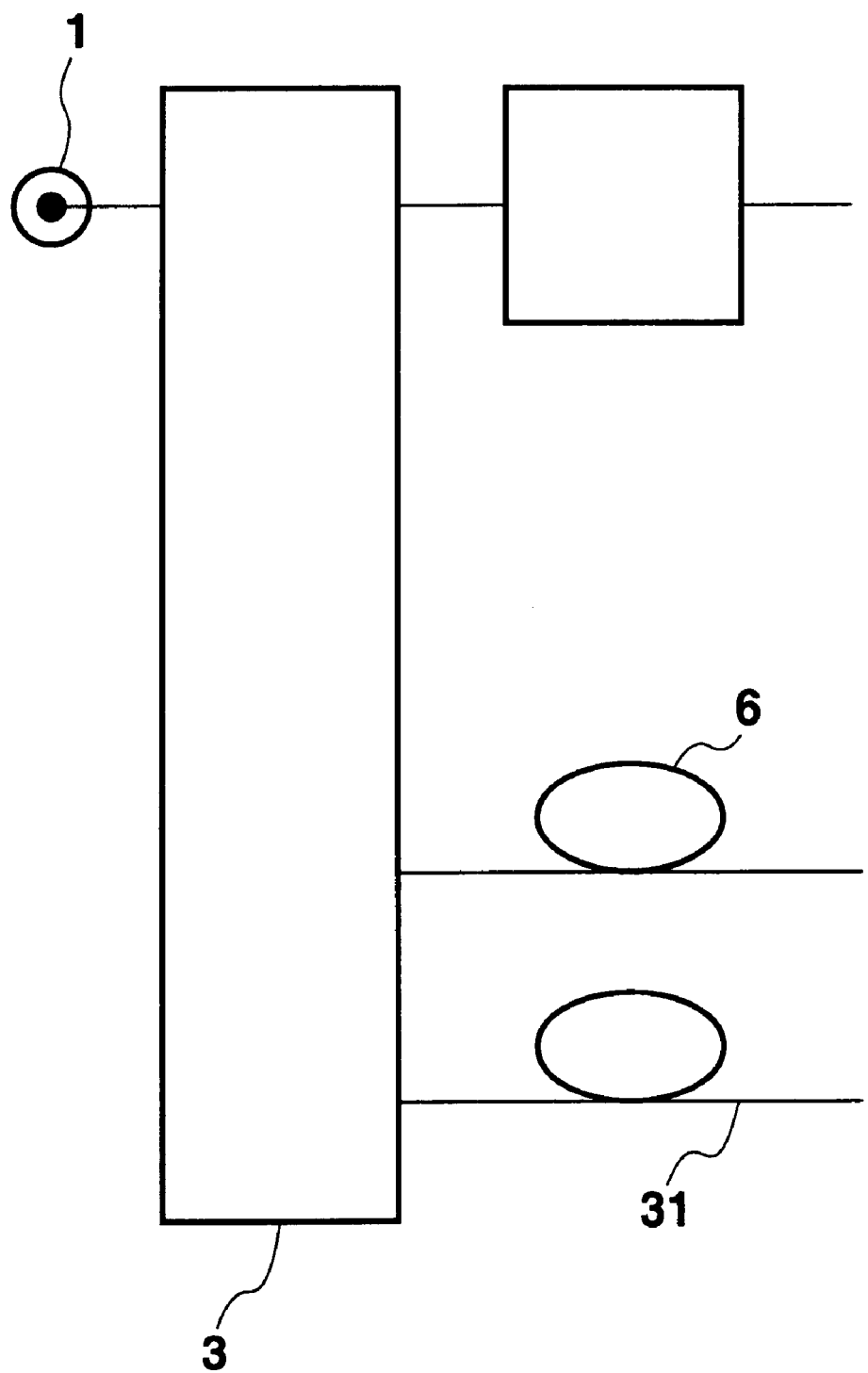
FIG. 26 shows a partially modified fifth and sixth embodiment of the present invention.

Furthermore, if the distributor 3 includes a function to distribute the input signal into n ways (n>2), as shown in FIG. 26, one of the output terminals of the distributor 3 can be used for outputting to the delay circuit 31 and the vector adjustment circuit 32.

Figure 27:
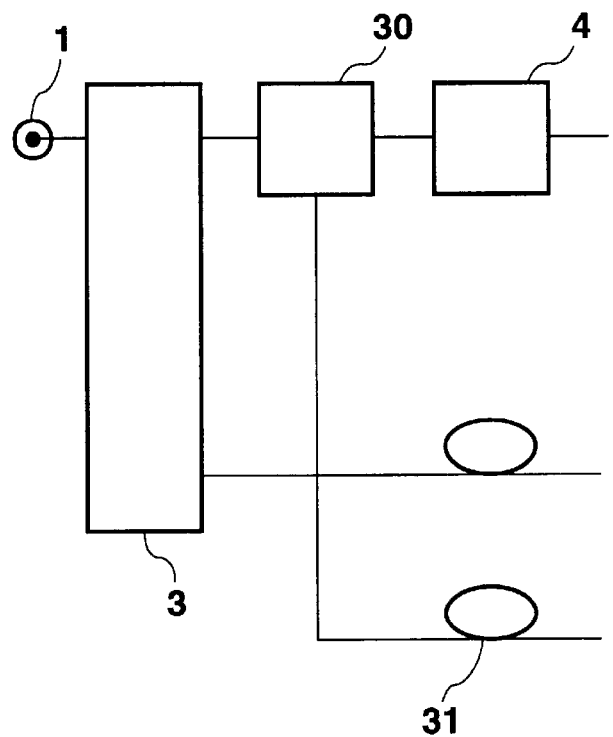
FIG. 27 shows a partially modified fifth and sixth embodiment of the present invention.
Figure 28:
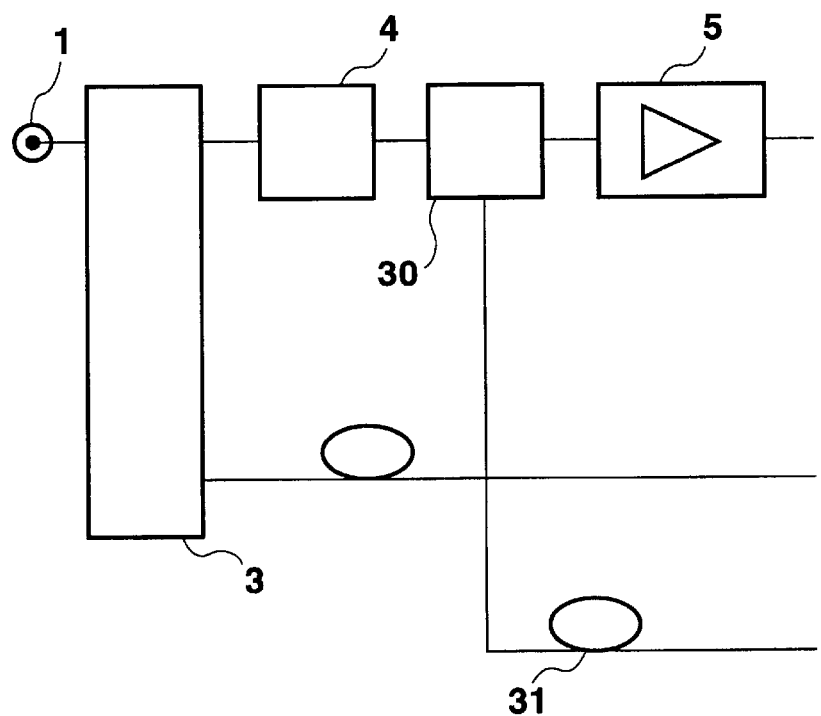
FIG. 28 shows a partially modified fifth and sixth embodiment of the present invention.
Figure 29:
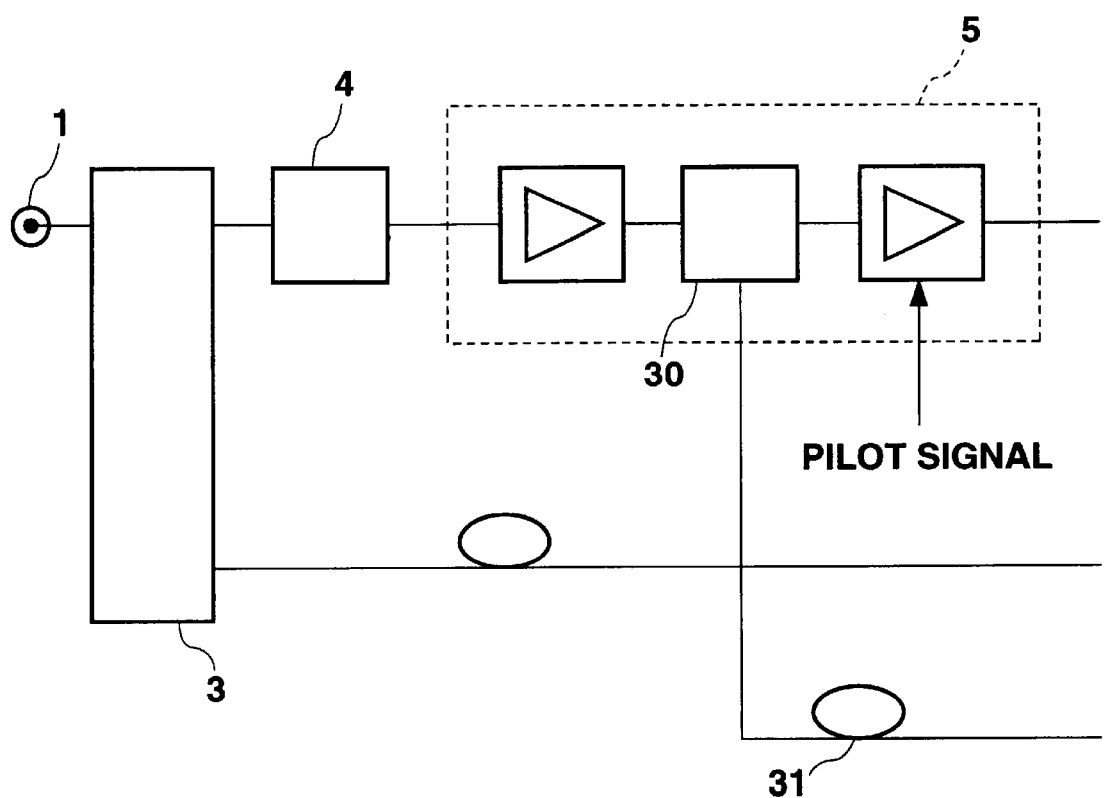
FIG. 29 shows a partially modified fifth and sixth embodiment of the present invention.
Figure 30:
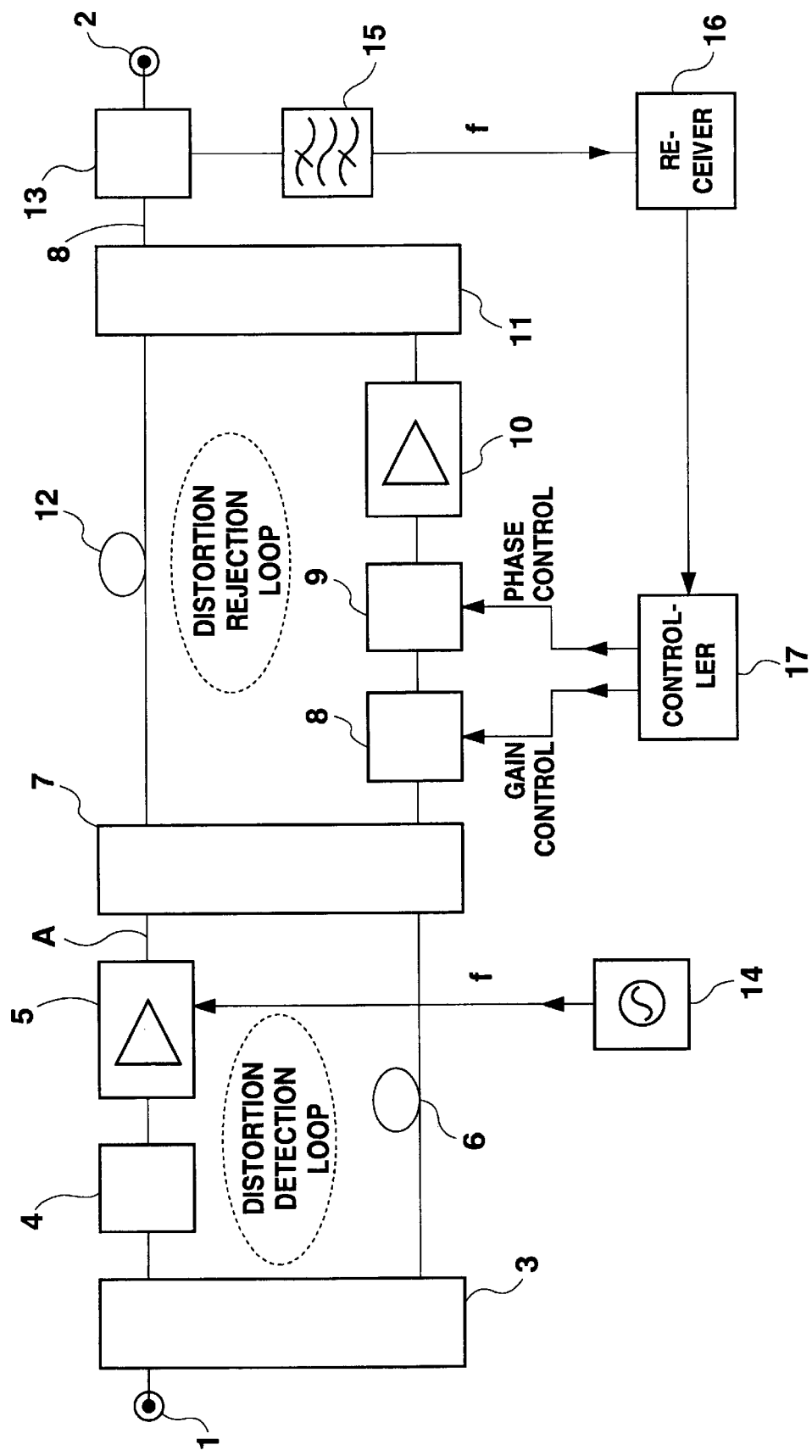
FIG. 30 is a block diagram showing a configuration of a conventional feed-forward amplifier.
Figure 31:
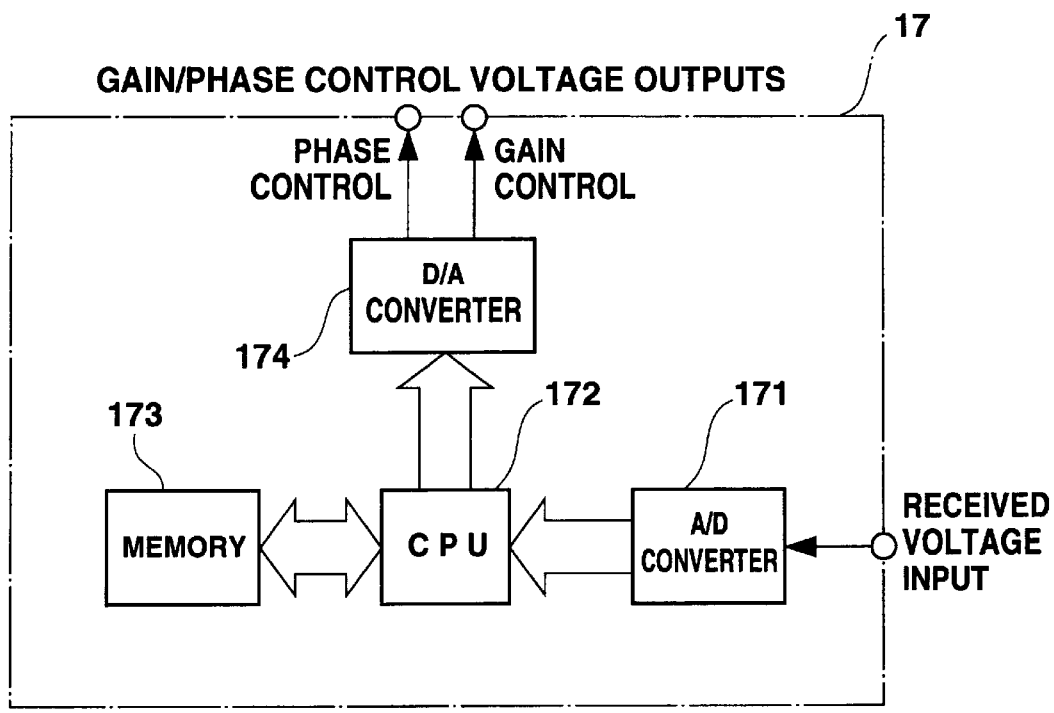
FIG. 31 shows a configuration of a conventional controller.
Figure 32:
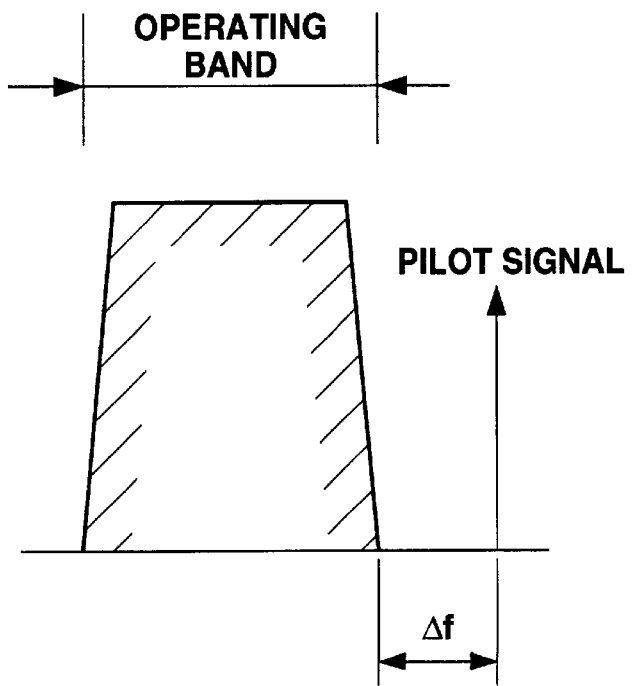
FIG. 32 shows an example of a conventional frequency allocation.
Figure 33:
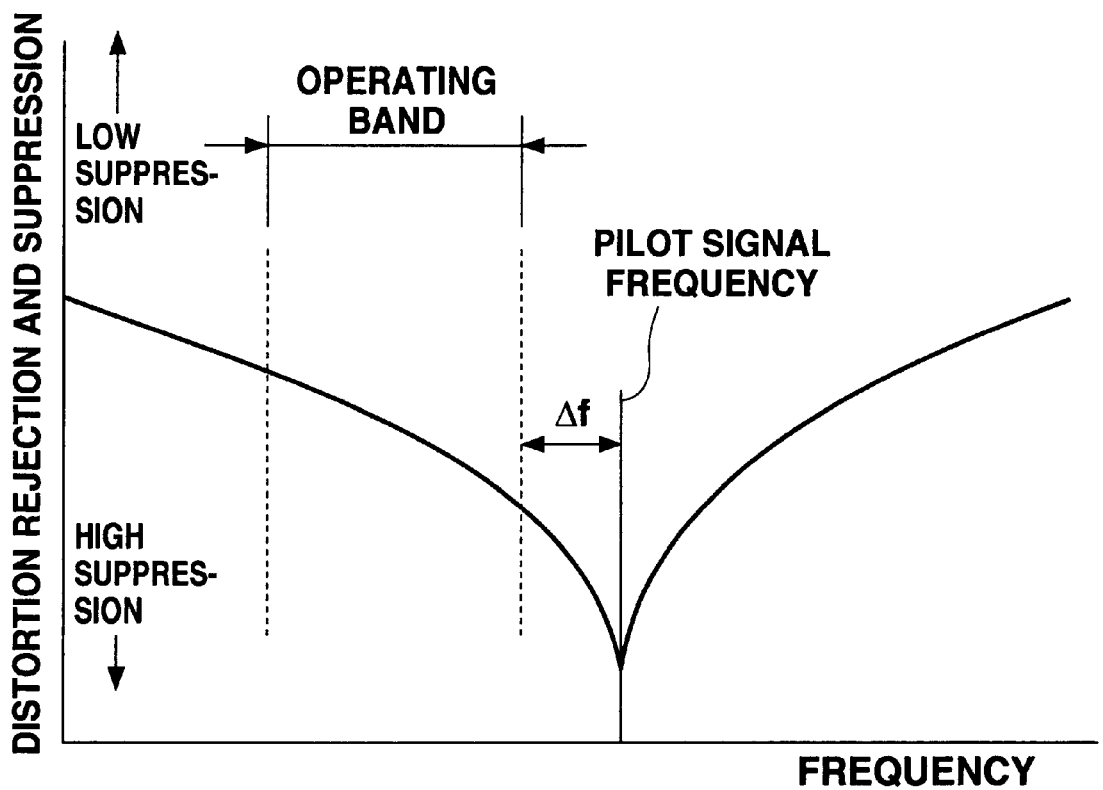
FIG. 33 shows one problem of the prior art.

Furthermore, as shown in FIGS. 27 to 29, the distributor 30 may be provided on the path from the distributor 3 via the main amplifier 5 to the directional coupler 7. The delay time of the delay circuit 31 can be shortened in FIG. 27 compared to FIGS. 19 and 23, or in FIG. 28 compared to FIG. 27, or in FIG. 29 compared to FIG. 28.

The example in FIG. 29 shows the distributor 30 provided at the connection point in the case where the main amplifier 5 includes a cascaded system of plural amplifying stages. In this example, the signal extracted by the distributor 30 has a relatively large amplitude so that the signal processing for canceling the main signal becomes simplified and the residual pilot signals can be extracted in a relatively preferred manner.

Furthermore, in the case where the main amplifier 5 itself is a feed-forward amplifier or the main amplifier 5 includes a plurality of amplifiers connected in parallel, a distributor or directional coupler provided within the main amplifier 5 may be used as the distributor 30.

In the above description, a radio frequency power amplifier of the base station and repeater for the CDMA standard cellular telephone system is assumed. However, the present invention can be implemented in cellular telephone systems of various types using the CDMA standard, in cellular telephone systems using a standard other than the CDMA standard, and in systems of other types requiring low-distortion amplification, and can also be used in applications other than radio frequency amplification or power amplification.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A controller for use in a feed-forward amplifier, said feed-forward amplifier comprising a main amplifier, a distortion detection loop, and a distortion rejection loop; said distortion detection loop coupling part of an input signal to said main amplifier and part of an output signal from said main amplifier by adjusting a mutual relationship of amplitude and phase of each other so as to generate a distortion signal; said distortion rejection loop coupling the distortion signal and an output signal from said main amplifier by adjusting a mutual relationship of amplitude and phase of each other so as to generate a low-distortion output signal; said controller supplying control signals to said distortion detection loop and said distortion rejection loop to control said adjustment operation so as to suppress distortion components generated by said main amplifier and remaining in the low-distortion output signal; said controller further comprising:

an injection-side mixer for up-converting a base pilot signal using a local oscillation signal to generate upper-side and lower-side pilot signals associated with frequency sum and difference between mixed signals respectively, injecting the upper-side and lower-side pilot signals into said distortion detection loop so that both of the upper-side and lower-side pilot signals appear in both of signals to be coupled at said distortion rejection loop;

a detection-side mixer for inputting part of the low-distortion output signal to down-convert the part of the low-distortion output signal by using the local oscillation signal in phase and at quadrature phase, to generate error signals of gain and phase; and a synchronizing detector for performing synchronizing detection on said error signals with the base pilot signal as a reference signal to generate said control signals for said distortion rejection loop;

wherein dominant frequencies of the local oscillation signal and the base pilot signal are set so that at least part of a frequency band of a signal to be amplified by the feed-forward amplifier is included between the frequency of the upper-side pilot signal and frequency of the lower-side pilot signal.

2. A controller according to claim 1 comprising a circuit to reject a component corresponding to an input signal to said main amplifier from the low-distortion output signal that is input to said detection-side mixer by performing anti-phase addition of a signal, which includes a component corresponding to a signal to be amplified by said feed-forward amplifier and does not include the upper-side and lower-side pilot signals, to the low-distortion output signal that is input to said detection-side mixer.

3. A controller according to claim 1 comprising a modulator for performing spread spectrum modulation on at least either the local oscillation signal or the base pilot signal so that the spectrums of the upper-side and lower-side pilot signals are spread in a frequency band having significant bandwidth.

4. A controller according to claim 3 comprising:
said modulator disposed so that a spectrum of the reference signal that is input to said synchronizing detector becomes a non-spread spectrum signal; and
a circuit for performing despread spectrum modulation on the error signals that are input to said synchronizing detector so that the spectrum thereof becomes a non-spread spectrum signal.

5. A controller according to claim 2 wherein a dominant frequency or frequency band of the local oscillation signal and the base pilot signal is set so that at least part of the upper-side or lower-side pilot signal enters the frequency band of a signal to be amplified by said feed-forward amplifier.

6. A controller according to claim 3 wherein a dominant frequency or frequency band of the local oscillation signal and the base pilot signal is set so that at least part of the upper-side or lower-side pilot signal enters the frequency band of a signal to be amplified by said feed-forward amplifier.

7. A controller according to claim 1 comprising a filter for extracting a frequency component having a frequency equal to or including the frequency of the base pilot signal from the error signal obtained at said detection-side mixer; said filter supplies the extracted frequency component as error signals to the synchronizing detector.

8. A controller according to claim 1, wherein:
the frequency of the local oscillation signal belongs to the frequency band of a signal to be amplified by the feed-forward amplifier; and
the frequency of the base pilot signal is lower than the frequency of the local oscillation signal.

9. A controller according to claim 8 wherein:
the frequency of the local oscillation signal is located substantially at the center of the frequency band of a signal to be amplified by the feed-forward amplifier; and
the frequency of the base pilot signal is ½ or more of the frequency band width.

10. A controller according to claim 8 wherein:
the frequency band of the input signal to the main amplifier is divided into a plurality of channels, each having a predetermined channel bandwidth;
the dominant frequency of the local oscillation signal belongs to a guard band disposed between one channel and an adjacent channel; and
the dominant frequency of the base pilot signal is a frequency that is a natural multiple of the predetermined channel bandwidth.

11. A controller according to claim 1 comprising:
a first oscillator for generating the local oscillation signal; and
a second oscillator for generating the base pilot signal.

12. A feed-forward amplifier comprising a main amplifier, a distortion detection loop, a distortion rejection loop, and a controller; said distortion detection loop coupling part of an input signal to said main amplifier and part of an output signal from said main amplifier by adjusting a mutual relationship of amplitude and phase of each other so as to generate a distortion signal; said distortion rejection loop coupling the distortion signal and the output signal from said main amplifier by adjusting a mutual relationship of amplitude and phase of each other so as to generate a low-distortion output signal; said controller supplying control signals to said distortion detection loop and said distortion rejection loop to control said adjustment operation so as to suppress distortion components generated by said main amplifier and remaining in the low-distortion output signal; said feed-forward amplifier comprising:

an injection-side mixer for up-converting the base pilot signal using the local oscillation signal to generate upper-side and lower-side pilot signals associated with frequency sum and difference between mixed signals respectively, injecting the upper-side and lower-side pilot signals into said distortion detection loop so that both of the upper-side and lower-side pilot signals appear in both of signals to be coupled at said distortion rejection loop;

a detection-side mixer for inputting part of a low-distortion output signal to down-convert the part of the low-distortion output signal by using the local oscillation signal in phase and at quadrature phase to generate error signals of gain and phase; and a synchronizing detector for performing synchronizing detection on said error signals with the base pilot signal as a reference signal to generate said control signals for said distortion rejection loop;

wherein the dominant frequencies of the local oscillation signal and the base pilot signal are set so that at least part of a frequency band of a signal to be amplified by the feed-forward amplifier is included between the frequency of the upper-side pilot signal and a frequency of the lower-side pilot signal.

13. A feed-forward amplifier comprising a main amplifier, a distortion detection loop, a distortion rejection loop, and a controller; said distortion detection loop coupling pan of an input signal to said main amplifier and part of an output signal from said main amplifier by adjusting a mutual relationship of amplitude and phase of each other so as to generate a distortion signal; said distortion rejection loop coupling the distortion signal and the output signal from said main amplifier by adjusting a mutual relationship of amplitude and phase of each other so as to generate a low-distortion output signal; said controller supplying control signals to said distortion detection loop and said distortion rejection loop to control said adjustment operation so as to suppress distortion components generated by said main amplifier and remaining in the low-distortion output signal; said feed-forward amplifier comprising:

an injection-side mixer for up-converting the base pilot signal using the local oscillation signal to generate upper-side and lower-side pilot signals associated with frequency sum and difference between mixed signals, and injecting the upper-side and lower-side pilot signals into said distortion detection loop so that both of the upper-side and lower-side pilot signals appear in both of signals to be coupled at said distortion rejection loop;

means for branching part of the low-distortion output signal;

means for rejecting, during branching or after branching, components corresponding to a signal to be amplified at said feed-forward amplifier by performing anti-phase addition of part of the input signal to said main amplifier to the part of said low-distortion output signal;

a detection-side mixer for inputting the low-distortion output signal after said anti-phase addition to down-convert the low-distortion output signal by using the local oscillation signal in phase and at quadrature phase to generate error signals of gain and phase; and a synchronizing detector included in said controller for performing synchronizing detection on said error signals with the base pilot signal as a reference signal to generate said control signals for said distortion rejection loop;

wherein the dominant frequencies of the local oscillation signal and the base pilot signal are set so that at least part of a frequency band of a signal-to be amplified by the feed-forward amplifier is included between the frequency of the upper-side pilot signal and a frequency of the lower-side pilot signal.

14. A controller for use in a feed-forward amplifier, said feed-forward amplifier comprising a main amplifier, a distortion detection loop, and a distortion rejection-loop; said distortion detection loop coupling part of an input signal to said main amplifier and part of an output signal from said main amplifier by adjusting a mutual relationship of amplitude and phase of each other so as to generate a distortion output signal; said distortion rejection loop coupling the distortion signal and an output signal from said main amplifier by adjusting a mutual relationship of amplitude and phase of each other so as to generate a low-distortion output signal; said controller supplying control signals to said distortion detection loop and said distortion rejection loop to control said adjustment operation so as to suppress distortion components generated by said main amplifier and remaining in the low-distortion output signal; said controller further comprising:

means for branching part of the low-distortion output signal;

means for performing anti-phase addition to reject a component corresponding to an input signal to said main amplifier, during branching or after branching, on the part of said low-distortion output signal and on part of the input signal to said main amplifier; and means for generating said control signals for said distortion rejection loop on the basis of a signal from which components corresponding to a signal to be amplified by said feed-forward amplifier as a result of said anti-phase addition are rejected.

15. A feed-forward amplifier comprising a main amplifier, a distortion detection loop, a distortion rejection loop, and a controller; said distortion detection loop coupling part of an input signal to said main amplifier and part of an output signal from said main amplifier by adjusting a mutual relationship of amplitude and phase of each other so as to generate a distortion output signal; said distortion rejection loop coupling the distortion signal and an output signal from said main amplifier by adjusting a mutual relationship of amplitude and phase of each other so as to generate a low-distortion output signal; said controller supplying control signals to said distortion detection loop and said distortion rejection loop to control said adjustment operation so as to suppress distortion components generated by said main amplifier and remaining in the low-distortion output signal; said feed-forward amplifier comprising:

means for branching part of the low-distortion output signal;

means for performing anti-phase addition to reject a component corresponding to an input signal to said main amplifier, during branching or after branching, on part of the input signal to said main amplifier and on the part of said low-distortion output signal; and means for generating said control signals for said distortion rejection loop on the basis of a signal from which components corresponding to a signal to be amplified by said feed-forward amplifier as a result of said anti-phase addition are rejected.

* * * * *